US010302682B2

United States Patent
Saito et al.

(10) Patent No.: US 10,302,682 B2
(45) Date of Patent: May 28, 2019

(54) DEVICE AND METHOD FOR ESTIMATION OPERATION STATUSES OF INDIVIDUAL ELECTRICAL APPLIANCES

(71) Applicant: Saburo Saito, Fukuoka (JP)

(72) Inventors: Saburo Saito, Fukuoka (JP); Mamoru Imanishi, Fukuoka (JP); Kosuke Yamashiro, Fukuoka (JP); Masakuni Iwami, Fukuoka (JP)

(73) Assignee: Saburo SAITO, Fukuoka (JP)

( * ) Notice: Subject to any disclaimer, the term of this patent is extended or adjusted under 35 U.S.C. 154(b) by 60 days.

(21) Appl. No.: 15/125,375

(22) PCT Filed: Mar. 13, 2014

(86) PCT No.: PCT/JP2014/056688
§ 371 (c)(1),
(2) Date: Sep. 12, 2016

(87) PCT Pub. No.: WO2015/136666
PCT Pub. Date: Sep. 17, 2015

(65) Prior Publication Data
US 2017/0074913 A1    Mar. 16, 2017

(51) Int. Cl.
*G01R 21/133* (2006.01)
*G01R 21/00* (2006.01)
*G01R 31/28* (2006.01)

(52) U.S. Cl.
CPC ........... *G01R 21/133* (2013.01); *G01R 21/00* (2013.01); *G01R 31/2825* (2013.01)

(58) Field of Classification Search
CPC .............. G01R 21/133; G01R 21/1331; G01R 21/1333; G01R 21/1336; G01R 21/1338;
(Continued)

(56) References Cited

U.S. PATENT DOCUMENTS 4,858,141 A    8/1989 Hart et al.

OTHER PUBLICATIONS

Cottone et al., User Activity Recognition for Energy Saving in Smart Homes, 2013 IFIP, 9 pp.*
(Continued)

*Primary Examiner* — Toan M Le
(74) *Attorney, Agent, or Firm* — Wenderoth, Lind & Ponack, L.L.P

(57) ABSTRACT

A device includes an electric power usage measurement unit, a time variation calculation unit, an electrical-appliance type identification unit, a corresponding likelihood estimation unit, and an operation-status estimation unit. The calculation unit calculates jumped electric power. The identification unit judges, from the jumped electric power, whether a new electrical appliance is added to or an extra type is deleted from a type list. The corresponding likelihood estimation unit estimates the likelihood of events to which electrical appliance up and down jumps correspond. The operation-status estimation unit estimates changes of operating states of the electrical appliances from the likelihood, thereby updating estimation of the present operating states and optimizing each estimation of the types, rated power consumption and the operating states based on predicted values and measured data using the updated operating states and estimation result of the rated power consumption to dynamically estimate operation probabilities of the electrical appliances.

20 Claims, 12 Drawing Sheets

(58) Field of Classification Search
CPC ........ G01R 21/007–008; G01R 21/001; G01R 21/00; G01R 31/2825
See application file for complete search history.

(56) References Cited

OTHER PUBLICATIONS

Lukaszewski et al., Methods of Electrical Appliances Identification in Systems Monitoring Electrical Energy Consumption, Sep. 12-14, 2013, The 7th IEEE International Conference on Intelligent Data Acquisition and Advanced Computing Systems: Technology and Applications, Berlin, Germany, pp. 10-14.*
International Search Report dated Apr. 22, 2014 in International (PCT) Application No. PCT/JP2014/056688.

* cited by examiner

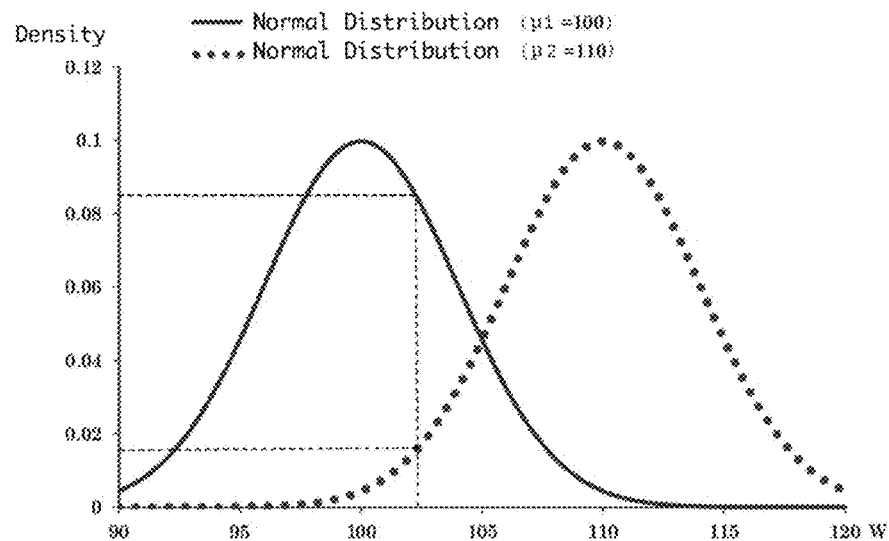

FIG.8

| Date | Wether | Maximum Temperature | Minimum Temperature | Humidity |
|---|---|---|---|---|
| 2013/3/12 Tus. | Fair Weather | 15.7 | 4.0 | 50 |
| 2013/3/13 Wen. | Fair Weather | 21.2 | 13.1 | 50 |
| 2013/3/14 Thu. | Fair Weather | 14.3 | 6.5 | 48 |
| 2013/3/15 Fry. | Fair Weather | 13.3 | 4.6 | 45 |
| 2013/3/16 Sat. | Fair Weather | 17.6 | 7.1 | 36 |
| 2013/3/17 Sun. | Fair Weather | 16.5 | 8.5 | 43 |
| 2013/3/18 Mon. | Fair Weather | 20.6 | 11.6 | 57 |
| 2013/3/19 Tus. | Fair Weather | 25.0 | 15.5 | 56 |

DEVICE AND METHOD FOR ESTIMATION OPERATION STATUSES OF INDIVIDUAL ELECTRICAL APPLIANCES

TECHNICAL FIELD

The present invention relates to an individual electrical-appliance operation-status estimation device that is capable of monitoring both of the types of operating electrical appliances in a plurality of electrical appliances and their operation statuses at the same time in real time, and it also relates to its method.

BACKGROUND OF THE INVENTION

In order to achieve more efficient usage of electric power, it is desirable to monitor operation states (operation statuses) of the individual electrical appliances. Such monitoring could be realized by attaching a sensor to each electrical appliance. This enables measuring operation statues (operational and non-operational statuses, and electric power consumption) of each electrical appliance, thereby making good use for electric energy conservation, electric power supply control and others by perceiving the operation statues of the electrical appliances based on the results measured by the sensors.

Attachment of a sensor to each of the electrical appliances, however, increases the number of sensors, which increases additional costs for attaching the sensors and constructing a system, such as a wireless one, to collect measurement signals outputted from the sensors, which is unavoidable from becoming high costs.

In order to solve such a problem, some technologies have been developed to make it possible to monitor the operation status of each electrical appliance without installing any sensor on each of the electrical appliances so that a monitoring device can be used in a household and the likes at a low cost.

Such a conventional individual electrical-appliance operation-status estimation device and a conventional method are disclosed in a patent document 1 shown below.

The individual electrical-appliance operation-status estimation device described in patent reference 1 implements Non-Instructive Appliance Load Monitoring (NIALM) that measures electric power usage and operation characteristics of each electrical appliances by using pattern recognition of pulse-type waveforms based of the electric characteristics of the total electric power usage of the operating electrical appliances.

That is, concretely, the prior individual electrical-appliance operation-status estimation device measures the electric characteristics (admittance consisting of conductance and susceptance) of total load of the electric circuits connected with equipment in a household, thereby generating analog signals proportional to the electric characteristics. The device includes sensing means, an AD convertor, and a signal processing means. The sensing means employs a voltmeter and an ammeter that are connected with the electric circuits at positions apart from the equipment. The AD convertor converts the analog signals into digital signals. The signal processor divides the total load of a plurality of units into parts corresponding to the respective units according to the digital signals.

Incidentally, using the above-described processed results, the operation statutes of electrical appliances are capable of being individually shown on a display.

PRIOR TECHNICAL REFERENCES

Patent Document

Patent Document 1: U.S. Pat. No. 4,858,141

DISCLOSURE OF THE INVENTION

Problem(s) to be Solved by the Invention

The above-described conventional individual electrical-appliance operation-status estimation device and method have, however, the following problem.

The prior technology described above needs information that is collected in advance about what kind of electrical appliances there are, what rated power consumption each of them has, and how many electrical appliances there are, in addition to updating of information about the individual electrical appliances every time in a case where at least one of them is disposed and/or new another one is added.

For this reason, there are problems in that the device and its method require a lot of labor and a high cost and that a non-professional person in an ordinary household does not seem likely to input and update the above-described information. Therefore, their actual applications are very difficult.

The present invention is made to solve the above-described problems, and its object is to provide a device and a method for estimating operation statuses of individual electrical appliances which are capable of identifying types of the individual electrical appliances and monitoring their operation statuses in real time without attachment of sensors to the individual electrical appliances respectively even when there is no prior information on the types and the number of the individual electrical appliances.

Means for Solving the Problems

In order to achieve the object, the individual electrical-appliance operation-status estimation device and its method of the present invention construct a dynamic algorism that estimates the types and the operation statuses of the individual electrical appliances in real time based on their total electrical power usage, by using a statistical inverse estimation method. So they perform a clustering analysis, so as to cluster (group) high generation frequency variations (jumped electric power) based on time variations in the total electrical power usage and estimate rated power consumption of the individual electrical appliances (types). Then they identify the types of electrical appliances, and then estimate the operation statuses thereof in real time based on the clusters of the types and the measured jumps to execute the algorism that changes the clusters as needed.

Specifically, the individual electrical-appliance operation-status estimation device of the present invention includes:

a wiring;

a total electric power usage measurement means for measuring total electric power usage of a plurality of electrical appliances that are connected with the wiring;

a time variation calculation means for calculating jumped electric power, which corresponds to the first order differences of time variations in the total electric power usage and is able to detect switching on and off, based on the total electric power usage measured by the total electric power usage measurement means;

an operating electrical-appliance type identification means for judging whether or not type of a new type of electrical appliance should be added to an existing type list based on the jumped electric power calculated by the time variation calculation means to execute a clustering process, where clusters correspond to types of the electrical appliances, in such a way that rated power consumption of each type of individual electrical appliance is recalculated in a case where the new types of the electrical appliance is added to the existing type list, an extra type being deleted from the existing type list as needed, and the existing type list being maintained in a case where the new types of the electrical appliance is not added to the existing type list;

a corresponding likelihood estimation means for estimating likelihood corresponding to occurrences of switching on and off events of the electrical appliances in which up and down jumps are generated; and an individual electrical-appliance operation-status estimation means for estimating changes of operation statuses of the individual electrical appliances when the likelihoods relating to the occurrences of switching on and off events of the individual electrical appliances which are obtained from the jumps of the total electric power usage in present statuses of the individual electrical appliances, are inputted, to update estimations of the operation statues statuses of the existing electrical appliances, optimizing estimations of the individual electrical appliance types, estimation of rated power consumption and estimations of the operation statues statuses in real time based on measured data of the total electric power usage and an estimated value of the total electric power usage estimated by using estimation results of updated operation statues statuses and estimation results of the updated rated power consumption of the individual electrical appliances, and dynamically estimating operation probabilities of the individual electrical appliances, which vary in intervals of the time variations in the measured total electric usage.

On the other hand, the individual electrical-appliance operation-state estimating method of the present invention includes:

connecting a plurality of electrical appliances with a wiring;

measuring total electric power usage of the plurality of electrical appliances;

calculating jumped electric power, which corresponds to the first order differences of time variations in the total electric power usage and is able to detect switching on and off, based on the total electric power usage measured by the total electric power usage measurement means;

judging whether or not a new type of the electrical appliance should be added to an existing type list based on the calculated jumped electric power to execute a clustering process, where clusters correspond to types of the electrical appliances, so that rated power consumption of each type of the individual electrical appliance is recalculated in a case where the new type of the electrical appliance is added to the existing type list, an extra type being removed from the existing type list as needed, and the existing type list being maintained in a case where the new type of the electrical appliance is not added to the existing type list;

estimating likelihood of occurrences of switching on and off events of to what electrical appliances up and down jumps are generated; and estimating changes of operation statuses of the individual electrical appliances when the likelihoods relating to the occurrences of switching on and off events of the individual electrical appliances which are obtained from the jumps of the total electric power usage in present operation statuses of the individual electrical appliances, are inputted, to change estimations of the operation statuses of the existing electrical appliances, optimizing estimations of the individual electrical appliance types, estimation of rated power consumption and estimations of the operation statuses in real time based on measured data of the total electric power usage and an estimated value of the total electric power usage estimated by using estimation results of changed operation statuses and estimation results of rated power consumption of the individual electrical appliances, and dynamically estimating operation probabilities of the individual electrical appliances, which vary in intervals of the time variations in the measured total electric usage.

Effect of the Invention

The individual electrical-appliance operation-status estimation device and its method of the present invention can monitor usage statuses of the individual electrical appliances, which are objectives to be monitored, without respectively attaching sensors to the individual electrical appliances and without obtaining prior information about how many and what kinds of the electrical appliances there are.

BRIEF DESCRIPTION OF THE DRAWINGS

FIG. 4 is a schematic view explaining k-means algorism that is implemented by the individual electric-appliance operation-status estimation device of the embodiment;

FIG. 5 is a view showing a table of state changes generated when a jump is positive in a Markov switching model used in the individual electric-appliance operation-status estimation device of the embodiment FIG. 6 is a view showing a table of state changes generated when the jump is negative in the Markov switching model used in the individual electric-appliance operation-status estimation device of the embodiment;

FIG. 8 is a view showing weather data as a part of data obtained in an actual household environment in an experiment for confirming the efficiency of the individual electric-appliance operation-status estimation device of the embodiment;

BEST MODE FOR CARRYING-OUT OF THE INVENTION

First, an individual electrical-appliance operation-status estimation device and its method according to the present invention are different from the prior technology described in the patent document 1.

That is, they are different in the points of:
(a) whether or not they focus on jumps that correspond to time variations in the total electric power usage, especially only on switching on and off of each electrical appliance,
(b) whether or not they use a statistical approach such as a k-means method (k-Means Clustering) algorithm,
(c) how much prior information about what electrical appliance is in operation is required, and
(d) whether or not a dynamic model that is capable of handling measured data of the total electric power usage on the time axis in an actual environment, such as data measured at one-minute intervals, is established.

The present invention employs a reverse estimation algorism to satisfy the features listed in the above-described points, while, at this present time, no algorism capable of solving the MIALM is known which can fulfill all of the above features.

Hereinafter, a best mode of the present invention will be described based on an embodiment with reference to the accompanying drawings.

Embodiment

In the embodiment, an example in which an individual electrical-appliance operation-status estimation device is applied to an ordinary house (household) will be described below.

Figure 1:
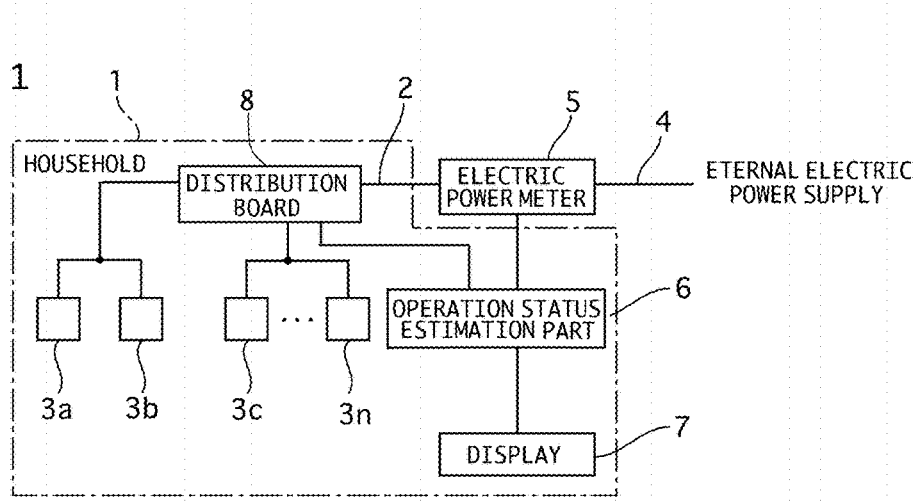
FIG. 1 is a view showing a state where an individual electrical-appliance operation-status estimation device of an embodiment according to the present invention is provided in a household equipped with a plurality of electrical appliance.

FIG. 1 shows a schematic diagram of an entire construction in a state where the individual electrical-appliance operation-status estimation device of the embodiment is provided in the household equipped with a plurality of electrical appliances, namely objectives to be monitored. Incidentally, the above-described reverse estimation algorism is a method for statically restoring perfect data from incomplete data.

As shown in FIG. 1, a plurality of wirings 2 are stretched around from a distribution board 8 in the household 1. A plurality of kinds of the electrical appliances 3a-3n (The suffix "n" is a positive integral number not less than two.) are connected or connectable with the wirings 2 through taps, plug sockets, and others at appreciate positions of the wirings 2. The electrical appliances 3a-3n include those of which load is irregularly generated like a Washlet (a trade name) toilet, and those which are always switched on like an intercom, in addition to those which are capable of being switched on and off like a refrigerator, a television set, a ceiling light, an air conditioner connected through the distribution board 8 independently from the former ones.

An electric power meter 5 is provided between the distribution board 8 in the household 1 and an outside power supply wire 4 so as to measure total electrical power usage being consumed in the household 1. Instead of this construction, measuring instruments may be provided to measure the electric power usage at every breaker of the distribution board 8. The electric power meter 5 and the distribution board 8 correspond to a total electric power usage measuring means of the present invention.

Hereinafter, the embodiment will be described about a case where the individual electrical-appliance operation-status estimation device uses the total electrical power usage measured by the electric power meter 5, while it may use the total electrical power usage obtained by all of the measuring instruments of the distribution board 8.

A signal relating to the total electrical power usage measured by the electric power meter 5 is sent to an operation status estimation part 6, and then the part 6 estimates types of the operating electrical appliances and their operation statuses, thereby the estimation result results being shown on a display 7. The electric power meter 5, the operation status estimation part 6, and the display 7 constitute the individual electrical-appliance operation-status estimation device of the embodiment.

Figure 2:
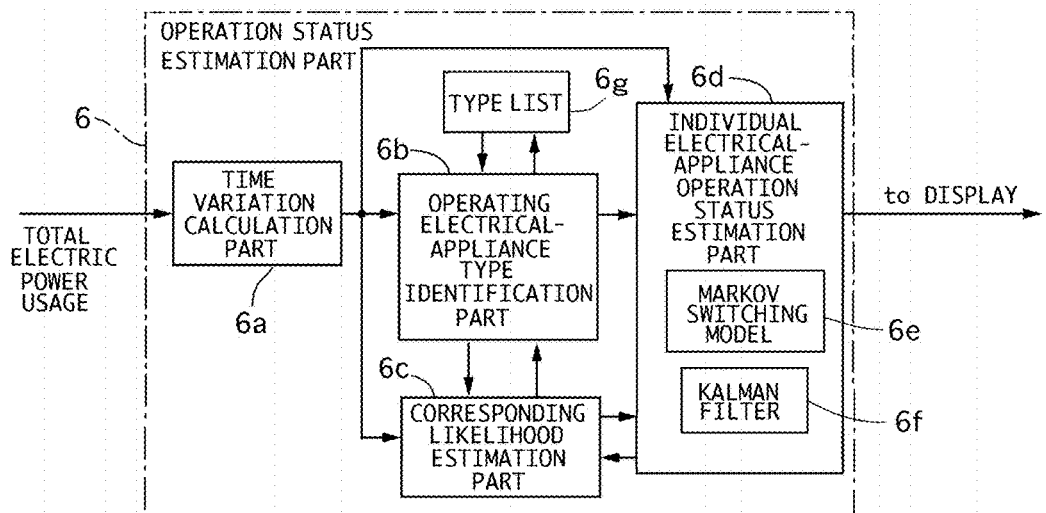
FIG. 2 is a functional block diagram showing a construction of the individual electrical-appliance operation-status estimation device of the embodiment.

The operation status estimation part 6 is made of a microcomputer for example, and its construction is shown in FIG. 2.

As shown in FIG. 2, the operation status estimation part 6 includes a time variation calculation part 6a, an operating electrical-appliance type identification part 6b, a corresponding likelihood estimation part 6c, an individual electrical-appliance operation-status estimation part 6d, and a type list 6g of the electrical appliances.

Hereinafter, the parts 6a-6g of the operation status estimation part 6 will be in detail explained.

The time variation calculation part 6a is inputted with the signal relating to the total electric power usage at the household 1, which is measured by the electric power meter 5, to calculate time variations between the present and last total electric power usage, namely the first order differences of the total electric power usage, at a predetermined intervals (one minutes in the embodiment), then outputting their time variation signals to the operating electrical-appliance type identification part 6b, the corresponding likelihood estimation part 6c, and the individual electrical-appliance operation-status estimation part 6d.

Incidentally, the time variation calculation part 6a corresponds to a time variation calculation means of the present invention.

The operating electrical-appliance type identification part 6b estimates rated power consumption of each individual electrical appliance based on the first order difference of the time variation (corresponding to a jump) calculated by the time variation calculation part 6a, then clustering the variations (jumped electric power) that occur at high frequency, thereby estimating the rated power consumption of each individual electrical appliance by the average of each cluster (type) of the jumped electric power.

Hereinafter, according to criterion to judge a new type of electric appliance, a jump is judged as a new type when the jump exceeds a certain ratio of a variance of the rated power consumption corresponding to the cluster. On the contrary, the electric power usage of the existing type of the electrical appliance/appliances is judged to be within normal variations ranges of the rated power consumptions when it does not.

That is, the operating electrical-appliance type identification part 6b judges whether there is a new type of electrical appliance, so as to create and add the new type to the existing type list 6g when the new type of electrical appliance is picked up, or so as to maintain the existing type list when it is not picked up.

In addition, when the new type of electrical appliance(s) is picked up, the rated power consumption of each type of the individual electrical appliances is recalculated, and an extra type, such as substantially overlapping type, is deleted (pruned) from the type list 6g as needed. Herein, the number of clusters of the types is set variable. The estimation of the rated power consumptions of the individual electrical appliances according to the jumps is carried on in real time with learning. The data in the new type list 6g obtained in this way is outputted to the corresponding likelihood estimation part 6c, the individual electrical-appliance operation-status estimation part 6d, and the type list 6g. Incidentally, the operating electrical-appliance type identification part 6b corresponds to a electrical-appliance type identification means of the present invention.

The corresponding likelihood estimation part 6c estimates likelihood (probability), for each type in the latest type list 6g obtained by the operating electrical-appliance type identification part 6b, about the switching on and off occurrences caused from what electrical appliance the first order difference of the time variation calculated by the time variation calculation part 6a, that is, up (the sign of the observed jump being positive) and down (the sign of the observed jump being negative.) jumps correspond to.

Incidentally, the corresponding likelihood estimation part 6c corresponds to a corresponding likelihood estimation means of the present invention.

The individual electrical-appliance operation-status estimation part 6d implements the learning in real time, about what electrical appliances are in operation and also about their operation statuses based on the first order differences of time variations (the jumps) calculated by the time variation calculation part 6a and the likelihood estimated by the corresponding likelihood estimation part 6c. In order to perform the above-described process, the individual electrical-appliance operation-status estimation part 6d is constructed to have a Markov switching model 6e and a Kalman filter 6f.

That is, when the part 6d is inputted, by using the model 6e, with the likelihood (probability) relating to the occurrences of switching on and off events of the individual electrical appliances being in operation at present, which provides the variation jumps of the total electric power usage, then estimating the operation statuses of what electrical appliance changes. It optimizes, by using the filter 6f, the estimation of the types of individual electrical appliances, the estimation of rated power consumptions, and the estimation of operation statuses based on measured data of the time variations of the total electric usage and the changes of the operation statuses. Then, the estimation results of the operation statuses of the individual electrical appliances are tallied up every weekday, every Saturday, every Sunday, and each time zone to implement the learning about usage patterns of the individual electrical appliances. In order to update a prior distribution based on the estimation results of the operation statuses of the individual electrical appliances and their previous patterns, the learning results are outputted to the corresponding likelihood estimation part 6c and the display 7.

Incidentally, the individual electrical-appliance operation-status estimation part 6d corresponds to an individual electrical-appliance operation-status estimation means of the present invention.

The type list 6g of the electrical appliances stores the values (the average and the variance) of a rated power consumption of the different type that has been newly picked up. The stored data is sent to the operating electrical-appliance type identification part 6b, where the sent data is used for a calculation, and the data is rewritten based on the calculation results as needed.

Next, a flow of the operation status estimation process, which is executed by the operation status estimation part 6, of the individual electrical appliances will be explained with reference to a flowchart shown in FIG. 3.

The NIALM real-time reverse estimation algorism is employed to estimate the operation statuses of the individual electrical appliances as described above. Herein, a main part of a dynamic estimation model representing the time variations of the total electric power usage is a model generally called as a State Space Model.

The ultimate outputs of the reverse estimation model are estimation of the operation statuses of switching on and off of the individual electrical appliances that change from moment to moment at time intervals (one minutes in the embodiment) corresponding to input stream of the time variations of the measured total electric power usage.

Figure 9:
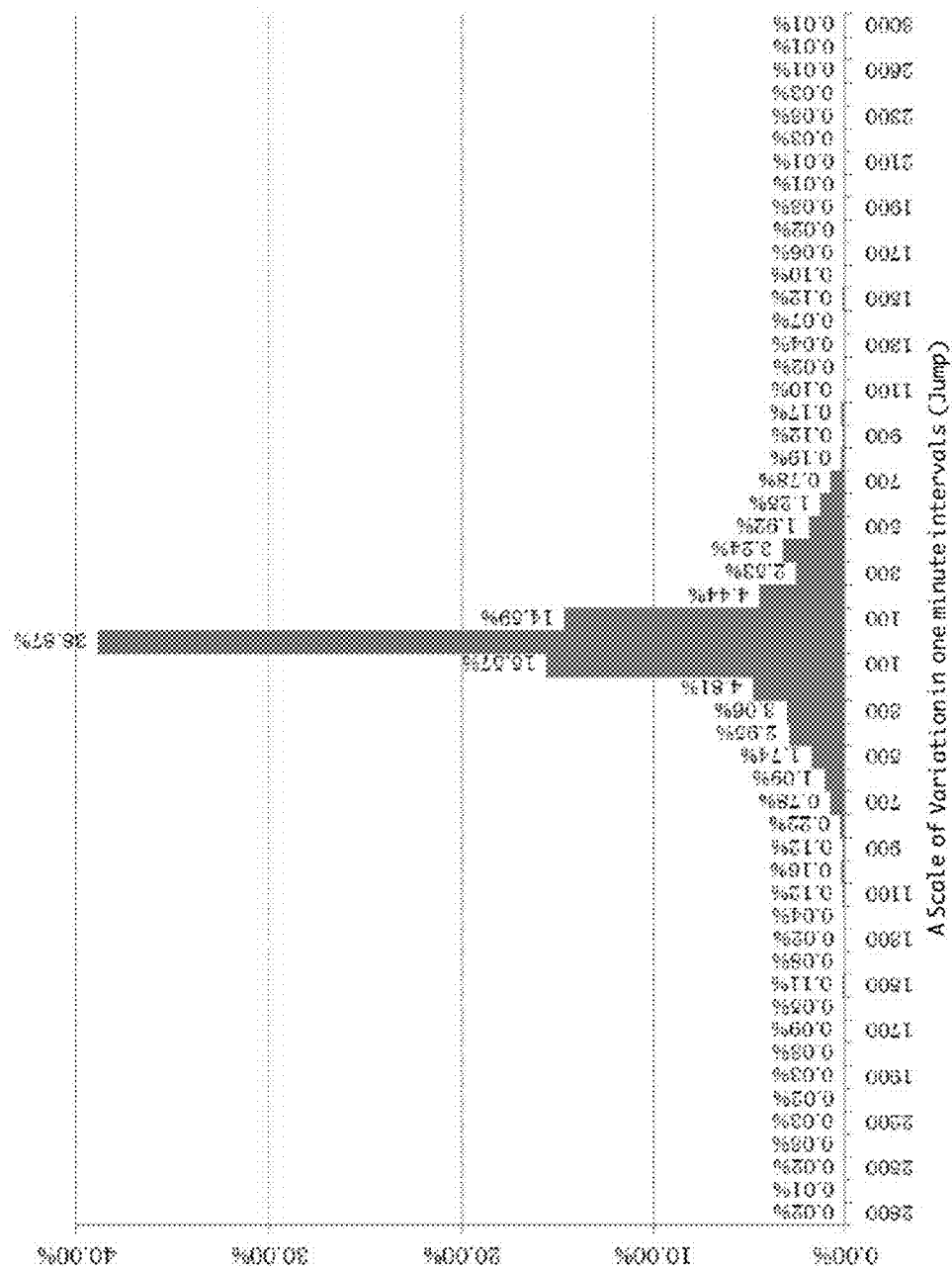
FIG. 9 is a diagram showing frequency distribution of the total electrical power consumption represented by a scale of jump at one-minute intervals in the experiment.

This focus on the jumps corresponding to the time variations of the total electric power usage depends on the following idea. That is, vertical jumps (jumps where these signs become positive) of the rated power consumptions occur when at least one of the electrical appliances is switched on, and the on-switched electrical appliance is switched off at any one point of time after switched on. This causes negative jumps to occur and cancel the vertical jumps so that the total electric power usage of the electrical appliances becomes zero. Incidentally, this idea is verified to be right from an actual case as shown in FIG. 9.

Herein, it is necessary to clearly define the operation status of individual electrical appliance as the state variables. A model is constructed so that the state variables of the operation statuses of individual electrical appliances are defined as their operation probabilities on the simple assumption that the number of electrical appliances belonging to each type of the estimated individual electrical appliances is only one. However, this simple assumption that the number of the individual electrical appliances corresponding to the type is only one can be easily extended.

Hereinafter, the operation will be explained with reference to a flowchart shown in FIG. 3.

First, at step S1, the operation status estimation part 6 receives data on the total electric power usage of the household 1 from the electric power meter 5. Then, the flow goes to step S2.

At the step S2, the time variation calculation part 6a calculates values of the first order differences (jumped electric power) of the time variations of the total electric power usage at the predetermined intervals (one minutes in the embodiment), then outputting data on the calculation of the jumped electric power to the operating electrical-appliance type identification part 6b, the corresponding likelihood estimation part 6c, and the operation status estimation part 6d. Then, the flow goes to step S3.

At the step S3, the operating electrical-appliance type identification part 6b judges whether or not the jumped electric power obtained at the step S2 corresponds to a new type different from the types stored so far by using the list 6g of the types (corresponding to the clusters) that have been stored by the learning gradually from the beginning, the rated power consumption (average and variance) of each type, and data on the operation probabilities. In a case where the judgment results is the new type (if YES), the flow goes to step S4, while in a case where it is not the new type (if NO), the flow goes to step S5.

Specifically, in a case where the number of types is small such as 0 or 1 at the beginning, the judgment criterion to add a new type is set lax, whereas after a long period of time elapses and a sufficient length of data can be obtained, a more sever judgment criterion may be used such as statistical information. The type list 6g is maintained at the time when the elapsed time is short, for example, when the calculation of the jumped electric power is not more than 10% of the rated power consumption, while a new type is added to the type list 6g when it is not less than 10% of the rated power consumption.

At the step S4, the number of the stored existing types (clusters), k is increased. An absolute value of the jumped electric power obtained at the step S2 is determined as the rated power consumption (corresponding to an average of its cluster) of a new type, and then the type list 6g is updated. Then, the flow goes to the step S5.

At the step S5, according to the number of newly increased clusters, k, the average of rated power consumption of each type is recalculated. That is, in the time-series data on the total electric power usage measured at one minute intervals, data prior to past data with a determined length is deleted. Concretely, for example, the data prior to the latest one-day (1,440 minutes) or the latest one week (10,080 minutes) is eliminated, and data where the jumped electric power is not zero is picked up as data to be used. The rated power consumptions (the averages of the clusters) of types added to the type list 6g are recalculated by using the data picked up. Then, the flow goes to step S6.

At the step S6, the reanalysis of clusters is implemented based on the calculation result of the averages of the rated power consumptions that are recalculated at the step S5, and then it is judged whether the overlapping extra type(s) should be pruned if there are the same rated power consumptions, in other words, if there are the same types. If this judgment result is YES, the flow goes to step S7, while if it is NO, the flow goes to step S8.

At the step S7, when the overlapping extra types are deleted from the existing type list 6g, the rated power consumptions (averages) of types, where the extra types are deleted, in the type list 6g are recalculated. The recalculated results are outputted to the type list 6g. Then, the flow goes to step S8.

At the step S8, the variations of the rated power consumption of each type in the updated type list 6g are calculated to output the data (the rated power consumption (the average) and the variance of each type) on the type list 6g to the corresponding likelihood estimation part 6c. Then, the flow goes to step S9.

At the step S9, the corresponding likelihood estimation part 6c compares the jumped electric power inputted from the time variation calculation part 6a with the data on the type list 6g (the average and the variance of the rated power consumption of each type) inputted from the operating electrical-appliance type identification part 6b, then estimating a likelihood (probability) of what electric appliance is switched on and off based on the amount and the signs of positive and negative of each jumped electric power. The information on the likelihoods is outputted to the individual electrical-appliance operation-status estimation part 6d. Then, the flow goes to step S10.

At the step S10, the individual electrical-appliance operation-status estimation part 6d estimates, by using the Markov switching model 6e, how the operation statuses of the individual electrical appliances change when the likelihoods, which are obtained at the step S8, relating to the occurrences of switching on and off events of the individual electrical appliances, where the occurrences are obtained from variation jumps of the total electric power usage in a state where the individual electrical alliances are currently in operation. Then it updates the estimation of the present operation statuses of the individual electrical appliances. The estimation results are outputted to the Kalman filter 6f. Then, the flow goes to step S11.

At the step S11, predicted values of the total electric usage are calculated by using the kalman filter 6f based on the data on the type list 6g which is inputted from the operating electrical-appliance type identification part 6b, more specifically, the averages of rated power consumptions of the respective types and the updated results of the present operation statuses of the individual electrical appliances which is inputted from the Markov switching model 6e at the step S10. Then, the predicted values are compared with the total electric power usage measured at the step S1 to optimize the real-time estimation of the types of the individual electrical appliances, the estimation of the rated power consumptions and the estimation of the operation statuses.

Figure 3:
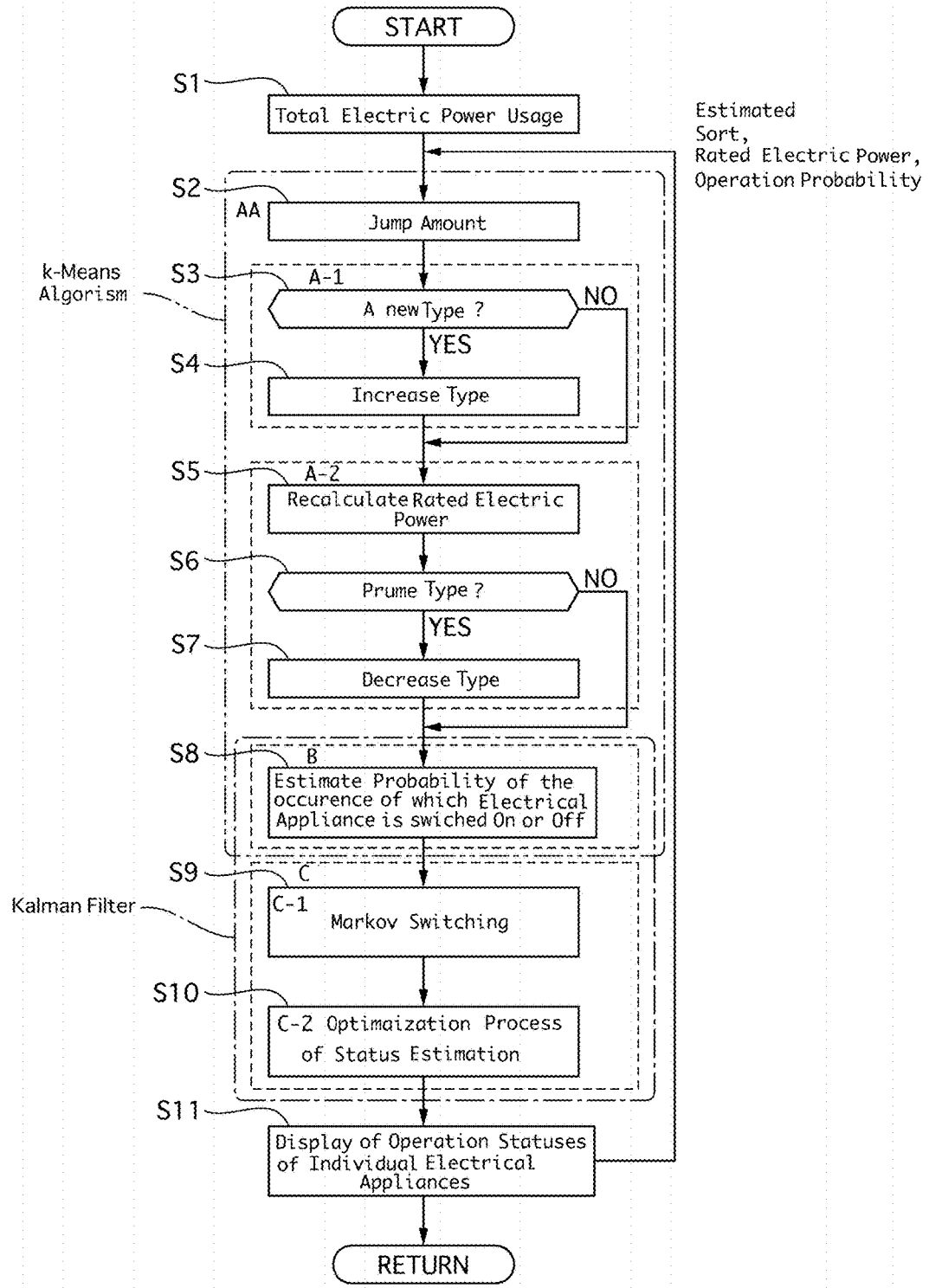
FIG. 3 is a flowchart showing a flow of a process estimating operation statuses of the individual electrical appliances and performed by the individual electric-appliance operation-status estimation device of the embodiment.

As explained above, the operation status estimation process of the individual electrical appliances consists of three main processes shown by areas A, B and C in FIG. 3.

That is, in FIG. 3, the process in the area A consists of the steps S2 to S7, corresponding to a process for picking up and identifying the types of the operating electrical appliances based on the first order differences of the time variations of the total electric power usage. The process in the area A is executed to judge whether a new electrical appliance type should be added to the existing individual electric-appliance type list and whether there are the same type as those in the existing type list in order to prune it from the existing list 6g.

On the other hand, the area B consists of the step S8, corresponding to a process for estimating the likelihoods about the occurrences of switching on and off events of what electrical appliances the first order differences of the time variations of the total electric power usage, namely the up and down jumps, correspond to.

Further, the area C consists of the steps S9 and S10, corresponding to a process for dynamically identifying the operation statuses of the individual electrical appliances momently varying during the intervals of the time variations of the measured total electric power usage.

In more details, the process in the area A consists of two processes. In the first process at the steps S3 and S4 shown in an area A-1, a new types are picked up. In a second process at the steps S5-S7 shown in an area A-2, the rated power consumptions are recalculated, the extra types being pruned.

In addition, the process in the area C consists of two processes. In the third process at the step S9 shown in an area C-1, the Markov switching model 6e is used to estate how the operation statuses of the individual electrical appliances change when it is inputted with the likelihoods (probabilities) relating to the occurrences of the switching on and off events of the individual electrical appliances which are obtained from the jumps of the total electric power usage in the present operation statuses of the electrical appliances. In the fourth process at step S10 shown in an area C-2, the Kalman filter 6f is used to optimize the estimation of the types of the total electric power usage, the estimation of the rated power consumptions and the estimation of the operation statuses based on the measured data of the time variations.

In the estimation process of the operation statuses of the individual electrical appliances shown in FIG. 3, the flow of the processes runs entirely according to a modeling method of the State Space Model.

That is, the processes in the areas A and B correspond to the variable k-means algorism, and the processes in the areas B and C correspond to a model part used in the Kalman filter 6e. The process in the area B overlapped with the areas A and C joins the k-means algorism and the Kalman filter, and the process B so that an output of the former is inputted to the latter. More specifically, in the processes in the area A, the k-means model are extended in such a way that the number "k" of clusters is set variable, maximum likelihood estimation values are obtained based on incomplete data by using the Expectation Maximization Algorism (EM algorism). The maximum likelihood estimation values relate to the averages and the variances of the rated power consumptions of the individual electrical appliances.

The explanation described above is an outline of the real-time reverse estimation algorism, which has been overviewed without mathematical expression.

Hereinafter, the details of the processes will be explained, using equations.

First, the k-means algorism executed in the areas A and B will be described.

The k-means algorism is also called a Gaussian Mixture Model. It estimates the averages and the variances of "k" number of normal distributions when a sample gives realized values of unknown "k" number of normal distributions to judge which normal distribution the realized value belongs to when the sample is given. Therefore, the k-means model is generally a kind of clustering models. However, it does not use an external criterion for sorting when clustering, and accordingly it is known as a kind of unsupervised learning algorism.

Various ways have been adopted to solve the k-means algorism, while the embodiment takes a stance using the Gaussian Mixture Model because of its most clear statistical concept, employing the EM algorism with a clear theoretical background of statics.

Incidentally, although the following symbols used in the following explanations are a little different from those in fonts used in the following equations in [Eq.] for convenience, they are the same ones in the meaning. In addition, when superiors and subscripts of symbols in [Eq. 1] to [Eq. 113] are overlapped in a vertical direction, they are offset in a horizontal direction so that the subscripts are followed by the superiors in the explanations.

From point of view of the Gaussian Mixture Model, the k-means model of the embodiment is a simple one-dimensional model.

That is, in number of samples are denoted as $x_i$ (i=1, ..., m), and k number of unknown normal distributions are denoted as $N(\mu, \sigma_j^2)$ (j=1, ..., k). Herein, k is known. Incidentally, for convenience of explanation, herein $\sigma_j$ (j=1, ..., k) is known, and $\sigma_j = \sigma\hat{}$ (j=1, ..., k), and all are identical. A sematic diagram in a case where k=2 is shown in FIG. 4.

It is apparent from FIG. 4, and the likelihoods obtained from the normal distributions $N(\mu_j, \sigma\hat{}^2)$ (j=1, 2), (the sample: $x_j$=2) become as follows, respectively

[Eq. 1]

$$l_{ij} = \frac{1}{\sqrt{2\pi}\,\hat{\sigma}} e^{-\frac{1}{2\hat{\sigma}^2}(x_i - \mu_j)^2}, \quad j = 1, 2 \qquad (1)$$

Herein, let the estimation values of the averages $\mu_j$=1, 2 at s-step in a present period in the convergence calculation be $\mu_j^{(s)}$, j=1, 2, the equation (1) is considered that the samples $x_i$ are the estimation values of the likelihoods obtained from two normal distributions $N(\mu, \sigma_j^2)$, j=1, 2; i=1, ..., m at the s-step, so that this is similarly expressed as $l_{ij}^{(s)}$, (i=1, 2; j=1, ..., m). In the method for solving the k-means model by using the EM algorism, each sample optimizes the likelihoods obtained from two unknown normal distributions. The unknown parameters $\mu_j$, j=1, 2 are calculated by the convergence calculation by the weighted averaging shown below.

[Eq. 2]

$$\mu_j^{(s+1)} = \frac{\sum_{i=1}^{m} l_{ij}^{(s)} x_i}{\sum_{i=1}^{m} l_{ij}^{(s)}}, \quad j = 1, 2; s = 0, 1, \ldots \qquad (2)$$

The right side of the equation (2) is a function of $\mu_j^{(s)}$, j=1, 2, allowing for the equation (1), being the convergence calculation that repeats $\mu_j$, j=1, 2. Thus, it is a procedure, in which, at first, initial values $\mu_j^{(s)}$, j=1, 2 of the unknown parameters $\hat{\mu}_j$, j=1, 2 are decided, and then $\mu_j^{(s)}$, S=0, 1, 2, ... are serially calculated according to the equation (2) to obtain the estimation values $\mu_j\hat{}$, j=1, 2 of the unknown parameters $\mu_j$, j=1, 2 when they converge.

From the above-described explanation, even when the sample $x_i$ becomes multiple dimensions, the likelihoods in the equation (1) can be similarly obtained although variance-covariance matrix needs to be set, so that the similar method can be used in that case.

Herein, an explanation will be given about whether the equation (1) converges and whether the likelihoods of the Gaussian Mixture Model are optimized when it converges.

As a matter of fact, the EM algorism is a general algorism that provides the maximum likelihood estimation value from incomplete data. The EM algorism is one that has monotonicity (enhancement) of the likelihoods, although it does not guarantee global optimization.

Hereinafter, the k-means model is converted to a problem of the maximum likelihood estimation method on the basis of incomplete data, which introduces the EM algorism that solves the k-means model as the Gaussian Mixture Model.

The strict definition of incomplete data will be later described. In addition, the likelihood and the maximum likelihood estimation method of a model including incomplete data will be later described. Herein, the incomplete data is comprehended as unobserved probability variables or latent variables, and the k-means model is mathematically formulated.

A key of the k-means model as the Gaussian Mixture Model is that it is unknown from what normal distributions of k number of normal distributions $N(\mu, \sigma_j^2)$, $j=1, \ldots, k$ the samples come, in other words, all of the samples are not observed. If they are known, it is easy to obtain the averages of the k number normal distributions and the maximum likelihood estimation values of the variances by using the normal maximum likelihood estimation method. Although complete data is not observed in general, probability variables obtained when all of the data is assumed to be observed are introduced as latent probability variables to make a model.

Now, getting back to the one-dimensional k-means model, the latent probability variables are introduced to mathematically formulate the k-means model.

The probability variables $Z_{ij}$ are not observed, but they are supposed to be latent probability variables that become 1 when $x_i$ is a sample from the $j^{th}$ normal distribution $N(\mu, \sigma_j^2)$ and that become 0 when $x_i$ is not.

[Eq. 3]

$$Z_{ij} = \begin{cases} 1 & \text{if } x_i \text{ from } N(\mu_j, \sigma_j^2) \\ 0 & \text{otherwise} \end{cases} \quad (3)$$

Supposing the unobserved probability variables $Z_{ij}$ and assuming that $Z_{ij}$ are observed, complete data $y_i$, $i=1, \ldots, m$ is expressed by the following equation.

Complete Data:
[Eq. 4]

$$y_i = (x_i, z_{ij}, j=1, \ldots, k), i=1, \ldots, m \quad (4)$$

Statistical Model:

[Eq. 5]

$$x_i \sim N(\mu_j, \sigma_j^2), j=1, \ldots, k \quad (5)$$

[Eq. 6]

$$Z_{ij} = \begin{cases} 1 & \text{if } i \text{ from } N(\mu_j, \sigma_j^2) \\ 0 & \text{otherwise} \end{cases} \quad (6)$$

As described above, herein, it is assumed that the sample $x_i$ can be observed, while $Z_{ij}$, $j=1, \ldots, k$ cannot be observed.

The likelihood functions corresponding to the complete data $y_i = (x_i, z_{ij}, j=1, \ldots, k, i=1, \ldots, m$ are obtained as follows by using a normal procedure. Herein, the unknown parameters $(\mu, \sigma_j^2)$, $j=1, \ldots, k$ are putted together, being expressed by hypothesise $h = [(\mu, \sigma_j^2), j=1, \ldots, k]$. When the present hypothesise is $h' = [(\mu', \sigma_j'^2), j=1, \ldots, k]$, the likelihood of the complete data under this hypothesise is expressed by the following equation.

[Eq. 7]

$$p(y_i \mid h') = \prod_{j=1}^{k} \left( \frac{1}{\sqrt{2\pi\sigma_j'^2}} e^{-\frac{1}{2\sigma_j'^2}(x-\mu_j')^2} \right)^{Z_{ij}} \quad (7)$$

$$= \prod_{j=1}^{k} \left( \frac{1}{\sqrt{2\pi\sigma_j'^2}} \right)^{Z_{ij}} e^{-\frac{1}{2}\sum_{j=1}^{k} Z_{ij} \frac{(x-\mu_j')^2}{\sigma_j'^2}}$$

In order to simplify the calculation, taking the logarithm of both members of the above equation, the likelihoods of the entire samples are obtained as follows. Herein, $y = (y_i, i=1, \ldots, m)$ is a complete data matrix.

[Eq. 8]

$$\log p(y \mid h') = \log \prod_{i=1}^{m} p(y_t \mid h') \quad (8)$$

$$= \sum_{i=1}^{m} \log p(y_i \mid h')$$

$$= \sum_{j=1}^{k} \left( -\frac{1}{2} \sum_{i=1}^{m} z_{ij} \log(2\pi\sigma_j'^2) \right) -$$

$$\frac{1}{2} \sum_{j=1}^{k} \sum_{i=1}^{m} z_{ij} \frac{(x_i - \mu_j')^2}{\sigma_j'^2}$$

$$= \sum_{j=1}^{k} \left( -\frac{1}{2} \sum_{i=1}^{m} z_{ij} \log 2\pi - \frac{1}{2} \sum_{i=1}^{m} z_{ij} \log \sigma_j'^2 - \right.$$

$$\left. \sum_{i=1}^{m} \frac{1}{2} z_{ij} \frac{(x_i - \mu_k')^2}{\sigma_j'^2} \right)$$

The maximum likelihood estimation value $(\mu_j^{''}, \sigma^{''2})$, $j=1, \ldots, k$ of $(\mu, \sigma_j^2)$ $j=1, \ldots, k$, which optimizes the logarithm likelihood, can be obtained as follows by optimizing the equation (8) with reference to $(\mu_j', \sigma^{'2})$, $j=1, \ldots, k$.

The maximum likelihood estimation value $\mu_j^{''}$, $j=1, \ldots, k$ of the average $\mu_j'$ $j=1, \ldots, k$ is obtained as follows by differentiating the equation (8) with reference to $\mu_j'$, $j=1, \ldots, k$ and calculating $\mu_j^{''}$, $j=1, \ldots, k$ under the first order condition.

[Eq. 9]

$$\hat{\mu}_j' = \frac{\sum_{i=1}^{m} Z_{ij} x_i}{\sum_{i=1}^{m} Z_{ij}}, j=1, \ldots, k \quad (9)$$

Further, the maximum likelihood estimation value $\sigma_j^{''2}$, $j=1, \ldots, k$ of the variance $\sigma_j^{'2}$, $j=1, \ldots, k$ is similarly obtained as follows by differentiating the equation (8) with reference to $\sigma_j^{'2}$, $j=1, \ldots, k$ and calculating under the first order condition.

[Eq. 10]

$$\frac{\sum_i Z_{ij}}{2} \cdot \frac{1}{\sigma_j'^2} \cdot (-1) \frac{1}{2} \cdot (-1) \frac{1}{(\sigma_j'^2)^2} \sum_{i=1}^{m} Z_{ij}(x_i - \mu_j')^2 = 0 \quad (10)$$

By solving this equation, the following equation can be obtained.

[Eq. 11]

$$\hat{\sigma}_j'^2 = \frac{\sum_{i=1}^{m} Z_{ij}(x_i - \hat{\mu}_j')^2}{\sum_{i=1} Z_{ij}} \quad (11)$$

Therefore, the maximum logarithim likelihood l* can be obtained by substituting the maximum likelihood estimation value ($\hat{\mu}_j$, $\hat{\sigma}'^2$), j=1, . . . , k into the equation (8).

[Eq. 12]

$$l^* = \sum_{j=1}^{k}\left(-\frac{1}{2}\sum_{i=1}^{m}Z_{ij}\log 2\pi - \frac{1}{2}\sum_{i=1}^{m}Z_{ij}\log\hat{\sigma}_j'^2 - \sum_{i=1}^{m}\frac{1}{2\hat{\sigma}_j'^2}Z_{ij}(x_i - \hat{\mu}_j')^2\right) \quad (12)$$

Herein, substituting the following equation, $$\hat{\sigma}_j'^2 = 1/(\Sigma_{i=3}{}^m Z_{ij})\cdot\Sigma_{t=1}{}^m Z_{ij}(x_i-\hat{\mu}_j')^2 \quad \text{[Eq. 13]}$$

then the equation (12) is expressed as follows.

[Eq. 14]

$$l^* = \sum_{j=1}^{k}\left(-\frac{1}{2}\sum_{i=1}^{m}Z_{ij}\log 2\pi - \frac{1}{2}\sum_{i=1}^{m}Z_{ij}\log\hat{\sigma}_j^2 - \frac{1}{2}\sum_{i=1}^{m}Z_{ij}\right) \quad (13)$$

$$= -\frac{1}{2}\log 2\pi\left(\sum_{i=1}^{m}\sum_{j=1}^{k}Z_{ij}\right) - \frac{1}{2}\sum_{i=1}^{m}\sum_{j=1}^{k}Z_{ij}\log\hat{\sigma}_i^2 - \frac{1}{2}\sum_{i=1}^{m}\sum_{j=1}^{k}Z_{ij}$$

$$= \frac{m}{2}(\log 2\pi + 1) - \frac{1}{2}\sum_{i=1}^{m}\sum_{j=1}^{k}Z_{ij}\log\hat{\sigma}_j^2$$

Herein, a case where the number "n" of clusters is not fixed but variable in the embodiment is considered. In order to decide the optimum number of cluster k*, Akaike's Information-theoretic Criterion (AIC) can be used.

By using the AIC, the optimum number of clusters can be k* that minimizes the AIC. The AIC can be defined by the following equation when the maximum logarithim likelihood l* is expressed by the number of parameters, "p".

[Eq. 15]

$$AIC = -2l^* 2p \quad (14)$$

The k-means model is need to be carefully treated because two parameters of average and variance increase when increasing the number of clusters, k by one. In addition, the maximum likelihood estimation value ($\hat{\mu}_j$, $\hat{\sigma}'^2$), j=1, . . . , k, the maximum logarithim likelihood l*, and the AIC change depend on the number of clusters, k. So, let them be expressed by a function of k like the AIC(k).

As the expression of the algorism to obtain the optimum number of clusters, k, k is serially increased one by one so that k satisfying AIC(k+1)>AIC(k) is set to be the optimum cluster number, k*.

After calculating ATC(k+1) and AIC(k) specifically, the following equations (15) and (16) are obtained as follows.

[Eq. 16]

$$AIC(k+1) = -2l^*(k+1) + 2(2(k+1)) \quad (15)$$

$$= -2\left(\frac{m}{2}(\log 2\pi + 1) - \frac{1}{2}\sum_{i=1}^{m}\sum_{j=1}^{k+1}Z_{ij}\log\hat{\sigma}_i^2(k+1)_i^2\right) + 4k + 2$$

[Eq. 17]

$$AIC(k) = -2l^*(k) + 2(2k) \quad (16)$$

$$= -2\left(\frac{m}{2}(\log 2\pi + 1) - \frac{1}{2}\sum_{i=1}^{m}\sum_{j=1}^{k}Z_{ij}\log\hat{\sigma}(k)_j^2\right) + 4k$$

Therefore, next step is to obtain k that establishes the following equation.

[Eq. 18]

$$AIC(k+1) - AIC(k) = -2l^*(k+1) + 2l^*k + 2 \quad (17)$$

$$= \sum_{i=1}^{m}\sum_{j=1}^{k}Z_{ij}\log\hat{\sigma}(k+1)_j^2 +$$

$$\sum_{i=1}^{m}Z_{i(k+1)}\log\hat{\sigma}(k+1)_{k+1}^2 -$$

$$\sum_{i=1}^{m}\sum_{j=1}^{k}Z_{ij}\log\hat{\sigma}(k)_j^2 + 2$$

$$= \sum_{i=1}^{m}Z_{j(k+1)}\log\hat{\sigma}(k+1)_{k+1}^2 +$$

$$\sum_{i=1}^{m}\sum_{j=1}^{k}Z_{ij}\log\left(\frac{\hat{\sigma}(k+1)_j^2}{\hat{\sigma}(k)_j^2}\right) + 2 > 0$$

In the incomplete data maximum likelihood estimation method, the EM algorism and the Generalized Expectation Maximization (GEM) algorism that expands the EM algorism to point-to-set mapping are applied to the estimation of a gravity model and the extension of the Iterative Proportional Fitting Procedure (IPFP) from incomplete data. First, the definition of incomplete data and the characterization of the GEM algorism will be explained.

Considering the probability variables Y and X, the data is realized values of the probability variables Y and X, being expressed by lowercases y and x, respectively. In general, when the probability variables y and x are in a correspondence relationship due to many-to-one mapping h, y is defined as complete data, and x is defined as incomplete data. That is,

[Eq. 19]

$$X = h(Y) \text{ many to one} \quad (18)$$

They are the same in an expression using data, and the following relationship is supposed between the complete data y and the incomplete data x.

[Eq. 20]

$$x = h(y) \text{ many to one} \quad (19)$$

This definition is a general and abstract one, but, in order to ensure its comprehension, let us confirm that the latent probability variables $Z_{ij}$, i=1, . . . , k is an example of the incomplete data.

The data vector of the sample is expressed by x(=xi; i=1, ..., m), and the latent variable data vector corresponding to the latent probability variables is expressed as z. z is expressed by its own definition as follows: z=(zij; i=1, ..., m, j=1, ..., k)

The complete data y is expressed by a combination of x and z as follows.

[Eq. 21]

$$y=(x,z) \quad (20)$$

Herein, the many-to-one mapping h is defined as follows.

[Eq. 22]

$$x=h(x,z)=h(y) \quad (21)$$

In actual, the fact that the mapping h has the many-to-one relationship is understood from that an image of the mapping h is always k for any value of z if the value of x paired with z is determined. This may be easily understood by an image about a projection of a two-dimensional plain of (x, z) onto an x-axis.

When only the probability variable x can be observed, that is, when only the incomplete data is observed, the maximum likelihood estimation method needs to decide values of unknown parameters that optimize the likelihoods generating the incomplete data, then supposing the unknown parameter values as the maximum likelihood values of the parameters.

This method is to calculate probabilities (likelihoods) generating the incomplete data x backwards to a model of the complete data y, in a certain model (parameters).

In other words, noting that inverse images corresponding to the images x of the mapping are a class of the complete data y that produces the images x, the probabilities (likelihood) generating the incomplete data x is one where the complete data y included in the inverse images $h^{-1}(x)$ occurs. That is, the sum of the probabilities (likelihood) generating the individual complete data y, which is included in the inverse images $h^{-1}(x)$, becomes the likelihood generating the incomplete data x. This mathematical expressions are shown as follows.

A class of the complete data y that generates the incomplete data x is defined as follows.

[Eq. 23]

$$h^{-1}(x)=\{y|x=h(y)\} \quad (22)$$

Expressing the probability (likelihood) where incomplete data x is generated as $g(x|\Phi)$, this is mathematically formulated as follows.

[Eq. 24]

$$g(x|\phi)=\int_{h^{-1}} f(y|\phi)dy \quad (23)$$

Therefore, the maximum likelihood estimation method of incomplete data is to determine the parameters Φ that optimize the likelihood shown in the equation (23).

In general, it is not so easy to solve an optimization problem in relation to likelihood $g(x|\Phi)$ of incomplete data. As this solution, methods such as the Expectation Maximization (EM) and the Generalized Expectation Maximization (GEM) are suggested.

The general outline of these methods is as follows.

First, the logarithm likelihood of incomplete data is expressed by L(Φ).

[Eq. 25]

$$L(\phi)=\log(g(x|\phi)) \quad (24)$$

Next, a conditional probability of complete data y when the incomplete data x and the parameters Φ are given is expressed by $k(y|x, \Phi)$.

[Eq. 26]

$$k(y|x,\phi)=f(y|\phi)/g(x|\phi) \quad (25)$$

In addition, Q(Φ'|Φ) and H(Φ'|Φ) are respectively defined as follows.

[Eq. 27]

$$Q(\phi'|\phi)=E[\log(f(y|\phi'))|x,\phi] \quad (26)$$

[Eq. 28]

$$H(\phi'|\phi)=E[\log(k(y|x,\phi'))|x,\phi] \quad (27)$$

From the above definitions, the logarithm likelihood L(Φ') is expressed as follows.

[Eq. 29]

$$L(\phi')=Q(\phi'|\phi)-H(\phi'|\phi) \quad (28)$$

Because, the following equation also holds because an equation of E[h(x)|x]=h(x) holds in general.

[Eq. 30]

$$L(\phi') = \log(g(x|\phi')) = E[\log(g(x|\phi'))|x,\phi] \\ = E[\log(f(y|\phi'))|x,\phi] - E[\log(k(y|x,\phi'))|x,\phi] \quad (29)$$

The EM algorism consists of two steps, where it is a repeated calculation method of calculating an estimation value $\Phi^{(n)}$ of Φ at an "n" step and calculating an estimation value $\Phi^{(n+1)}$ at an "n+1" step, that is, the to repeated calculation of $\Phi^{(n)} \to \Phi^{(n+1)}$, n=0, 1, 2, .... Herein, the following calculations are carried out in an expectation step (E-step) to judge whether it is a new step and a maximization step (M-step) estimating the averages, respectively.

Definition of the EM Algorism:
E-Step:

[Eq. 31]

$$Q(\phi|\phi^{(n)}) \quad (30)$$

M-Step:

[Eq. 32]

$$\phi^{(n+1)} = \max_{\phi \in \Omega} Q(\phi|\phi^{(n)}) \quad (31)$$

On the other hand, the GEM algorism is one that replaces the M-step of the EM algorism with the following point-to-set mapping M.

M-Step of the GEM Algorism:

[Eq. 33]

$$M\text{-step of the GEM algorism: } \phi^{(n)} \to \phi^{(n+1)} \in M(\phi^{(n)}) \quad (32)$$

Herein, the point-to-set mapping M is defined as follows.

[Eq. 34]

$$M(\phi)=\{\phi' \in \Omega | Q(\phi'|\phi) \geq Q(\phi|\phi)\} \quad (33)$$

Incidentally, it is known that the following equation holds.

[Eq. 64]

$$H(\phi'|\phi) \leq H(\phi|\phi) \quad (34)$$

By using this equation, the monotonicity (increasing characteristics) of the GEM is proved.

[Eq. 36]

$$L(M(\phi)) \geq L(\phi) \quad (35)$$

Therefore, if the logarithm likelihood $L(\Phi)$ has an upper limit, $L(\Phi^{(n)})$ converges to a certain value although a convergence of the function value to $L(\Phi^{(n)})$ does not immediately guarantee a convergence of $\Phi^{(n)}$.

Under a preparation described above, a solution by the EM algorism of the k-means model is set up.

First, the EM algorism requires a calculation of the E-step. The parameters of the k-means model are $h[(\mu_j, \sigma_j^2) j=1, \ldots, k]$, so that notations of h and h' are used instead of $\Phi$ and $\Phi'$, respectively.

In addition, the conditional expected values of the E-step become conditional expected values of the conditional logarithm likelihoods, which might be thought to be a complicated calculation. However, noting that the parameters as conditions of the conditional logarithm likelihoods do not cause any influence upon the calculation of the conditional expected values, the calculation of the equation (26) is just a calculation of the expected values of the complete data y based on $\Phi$ and the incomplete data x.

Then, how to obtain Q(h'|h), namely the conditional expected value $Q(\Phi'|\Phi)$ of the logarithm likelihood of the equation (26) is explained below. Q(h'|h) can be expressed as follows, referring to the equation (8).

[Eq. 37]

$$\begin{aligned}Q(h' \mid h) &= E[\log p(y \mid h') \mid h] \quad (36) \\ &= E_z[\log p(x, z \mid z, \mu', \sigma'^2) \mid x, \mu, \sigma^2] \\ &= E\left[-\frac{1}{2}\sum_{i=1}^{m}\sum_{j=1}^{k} z_{ij}\log 2\pi - \frac{1}{2}\sum_{i=1}^{m}\sum_{j=1}^{k} z_{ij}\log \sigma_j'^2 - \right.\\ &\quad \left.\frac{1}{2}\sum_{i=1}^{m}\sum_{j=1}^{k} z_{ij}\frac{(x_i-\mu_j')^2}{\sigma_j'^2}\bigg|_{x,\mu,\sigma^2}\right] \\ &= -\frac{1}{2}m\log 2\pi - \frac{1}{2}\sum_{i=1}^{m}\sum_{j=1}^{k} E(z_{ij} \mid x, \mu, \sigma^2)\log \sigma_j'^2 - \\ &\quad \frac{1}{2}\sum_{j=1}^{k}\sum_{i=1}^{m} E(z_{ij} \mid x, \mu, \sigma^2)\frac{(x_i-\mu_j')^2}{\sigma_j'^2}\end{aligned}$$

The characteristics of the GEM algorism is that the likelihood has the monotonicity of $L(h') \geq L(h)$ at any h that satisfies $Q(h'|h) \geq Q(h|h)$.

As described above, the EM algorism is a method in which the equation (36) is calculated at the E-step and a series of $\{h(n), n=1, 2, \ldots\}$ as $h^{(n+1)} = \text{argmax}_n Q(h|h^{(n)})$ is generated to regard a convergence point as a maximum likelihood value at the M-step.

As understood from the equation (36) of Q(h|h), there is a problem in the following calculation at the E-step.

[Eq. 38]

$$E(Z_{ij} \mid X_i = x_i, \mu = (\mu_1, \ldots, \mu_k), \sigma^2 = (\sigma_1^2, \ldots, \sigma_k^2)) \quad (37)$$

[Eq. 39]

$$Z_{ij} = \begin{cases} 1 & \text{if } x_t \sim N(\mu_j, \sigma_j^2) \\ 0 & \text{otherwise} \end{cases} \quad (38)$$

Herein, a calculation system of the equation (37) will be explained.

The equation (37) shows the form of a posteriori probability. That is, it calculates a posterior probability of an indicator probability variable $z_g$ that judges, based on the observed incomplete data $x_i$, what normal distribution $x_i$ comes from when the sample is given. Although the posterior probability is unknown, the likelihood of the occurrence of the incomplete data $x_i$ is definitely calculated when the indicator probability variable $z_g$ is given.

In other words, the posterior probability of the equation (37) is obtained as one that is proportional to a product of the prior distribution and the likelihood by using Bayes' theorem.

So, when the event where $z_g=1$ is expressed by $\Omega_{ij}$, the following equation holds.

[Eq. 40]

$$\Omega_{ij} = \{\omega \in \Omega | Z_{ij} = 1\} \quad (39)$$

On the other hand, $\Omega_j$ and $\Omega_{j'}$ are apparently exclusive to each other in regard to all of $j \neq j'$, so that the following equation holds.

[Eq. 41]

$$\Omega_{ij} \cap \Omega_{ij'} = \emptyset \quad (40)$$

In addition, the following equation also holds.

[Eq. 42]

$$\bigcup_{j=1}^{k} \Omega_{ij} = \Omega \quad (41)$$

Therefore, the following relationship holds between the expected value and the probability.

[Eq. 43]

$$E(Z_{ij}|x,\mu,\sigma^2) = 1 \cdot P(Z_{ij}=1|X=x_i,\mu,\sigma^2) \quad (42)$$

By using this equation, the following equation is obtained by using Bayes' theorem.

[Eq. 44]

$$P(Z_{ij}|X_i) \propto P(X_i|Z_{ij})P(Z_{ij}) \quad (43)$$

Assuming that the incomplete data $x_i$ is observed according to time order t, and let the posterior probability $P(z_g)$ expand to a prior probability depending on the observation of $X_{t-1}, \ldots, X_1$ immediately before the $t^{th}$ period. The equation (43) is expressed as follows where $\pi_{j|i-1} = P(z_y|X_{i-1}, \ldots, X_i)$.

[Eq. 45]

$$E(Z_{ij} \mid x, \mu, \sigma^2) = \frac{\frac{1}{\sqrt{2\pi\sigma_j^2}} e^{-\frac{1}{2}\frac{(x_i - \mu_j)^2}{\sigma_j^2}} \cdot \pi_{j|i-1}}{\sum_{j=1}^{k} \frac{1}{\sqrt{2\pi\sigma_j^2}} e^{-\frac{1}{2}\frac{(x_i - \mu_j)^2}{\sigma_j^2}} \cdot \pi_{j|i-1}} \quad (44)$$

[Eq. 46]

$$\phi_j(x_i) = 1 \bigg/ \left(\sqrt{2\pi\sigma_j^2}\right) \exp((-1/2) \cdot ((x_i - \mu_j)^2 / \sigma_j^2))$$

The EM algorism as a solution algorism of the k-means used in the embodiment can be combined with the above equation as follows.

E-Step:

[Eq. 47]

$$E(Z_{ij} \mid x, \mu, \sigma^2) = \frac{\phi_j(x_i) \pi_{j|i-1}}{\sum_{j=1}^{k} \phi_j(x_i) \pi_{j|i-1}} \quad (45)$$

M-Step:

[Eq. 48]

$$\hat{\mu}'_j = \frac{\sum_{i=1}^{m} E(Z_{ij} \mid x, \mu, \sigma^2) x_i}{\sum_{i=1}^{m} E(Z_{ij} \mid x, \mu, \sigma^2)} \quad (46)$$

[Eq. 49]

$$\hat{\sigma}'^2_j = \frac{\sum_{i=1}^{m} E(Z_{ij} \mid x, \mu, \sigma^2)(x_i - \hat{\mu}'_j)^2}{\sum_{i=1}^{m} E(Z_{ij} \mid x, \mu, \sigma^2)} \quad (47)$$

It is understood that the EM algorism is a repeated calculation method where it is inputted with h=[μ', σ2] to produce h'=[μ^', σ^'2] from the equations (46) and (47).

In the above-described explanation, a case where the number of clusters, k is fixed is treated in order to avoid the complicity. Nevertheless, the real-time reverse estimation algorism for the NIALM constituted in the embodiment employs the k-means model where the number of clusters, k is variable.

Next, the k-means model with the variable number of clusters, k will be described.

In the embodiment, the types of the electrical appliances are sequentially identified based on the total electric power usage observed at one-minute intervals, and its target is a model where the number of the types of the electrical appliances varies. That is, the target is an algorism to that estimates in real time what types of the electrical appliances there are and what of the operation statuses the electric appliances are in, based on the first order differences of the total electric usage at one minute intervals.

In the embodiment, the k-means model is applied to identify the types of the electrical appliances. The number of clusters, k is fixed at a preset number in normal k-means models, while naturally the number of clusters, k of the k-means model of the embodiment needs to be variable because the types of the electrical appliances correspond to the clusters in the k-means model.

The reason that the reverse estimation algorism needs to identify the types of the individual electrical appliances from the aspect of practical application will be explained below.

A scene is supported where a Home Energy Management System (HEMS) system is applied to individual households reaching up to 30 million family units in Japan. In a case where the reverse estimation algorism is installed in these households, a lot of labor hours and costs for installation thereof are needed, because the algorism does not work unless the types of the electrical appliances equipped in individual households are identified and then the system stores prior information on the types. It is desirable to establish a system with algorism having a learning function, not depending on the prior information as the system approaches closer to a practical stage. The embodiment deals with the systematization at a level close to such a practical application.

The method to decide the optimum number of clusters by using the AIC has been described with reference to the equations (15) to (17).

The above-described method may seem to be sufficient in theory, while it is not sufficient for a model aiming at its practical application. The reason being that there is no argument about how many samples, as unbiased estimators, can be within what extent of error range, where a limit concept of large sample theory exists in the definition of the AIC.

In actual, immediately after the algorism starts, the number of data (the number of samples) is small and the progress degree of learning by the algorism is small, so that the system fails soon when a new type of the individual electrical appliances is added and an overlapping type is pruned according to a criterion of the AIC. This problem is generally called as a cold-start problem, being known as such a problem in that a system does to not work well because the amount of usage history of new users are small even in a system design of a recommendation system and the likes.

So, allowing for the cold-start problem, an ad hoc and practical way is employed to decide the number of clusters in the embodiment.

Herein, the number of clusters expresses that of the types of the individual electrical appliances, and the averages of the normal distributions constituting the clusters correspond to the rated power consumptions of the individual electrical appliances.

The way employed by the embodiment to decide the number of the variable clusters is described below.

The embodiment focuses on the amounts of the electric power jumps of differences of the total electric power usage at one minute intervals.

A process, in the area A-1 shown in FIG. 3, to add a new type of the electrical appliances is identified based on the jump amount is executed as follows:

1) in a case where the jump amount is close to zero; It is judged whether there is no change in the operation statuses of the individual electrical appliances, and the process is followed by the next period.

On the other hand, 2) in a case where the jump amount is not equal to zero;
   a) when the jump amount is close to the rated power consumptions of the existing electrical appliances, the existing electrical appliance(s) is/are judged to become on or off, b) when the jump amount is substantially apart from the rated power consumptions of the existing electrical appliances, a new type of the electrical appliance is judged to be identified, and then the rated power consumption of the new type of the electrical appliances is set to correspond to the jump amount, the new type having this jump amount being added to the existing type list.

Thus, the process to judge whether or not the new type should be added executes one of: 1) addition of the new type to the existing type list of the electrical appliances and 2) no addition of a type to the existing type list. That is, as a criterion to judge about a new type, a new type is judged to exist in a case where the jump amount exceeds a certain ratio of the variance of rated power consumption, while the electric power usage of the existing types is judged to be within a normal variation range of the rated to power consumptions of the existing types, the existing type list being not changed, in a case where it does not.

The EM algorism is executed based on the type list of the electrical appliances determined by the process in the area A-1 to update and recalculate the rated power consumptions of the individual electrical appliances.

This is the following process to delete overlapping ones (pruning).

That is, the rated power consumptions and their variances are updated and the overlapping type(s) is/are pruned in the process of the area A-2.

1) The EM algorism is calculated by one step based on the type list, the rated power consumptions, and the variances of the rated power consumptions which are obtained in the process of the range A-1 to update them in the type list by recalculating the rated power consumptions of the individual electrical appliances and the variances of the rated power consumption.

2) Recalculating the rated power consumptions, the types judged to have the same rated power consumptions are put together into one type. That is, the overlapping type is deleted.

Thus, the process in the area A-2 is one that recalculate and updates the averages and the variances by using the EM algorism. Herein, similarly, whether type belongs to the same types is judged depending on a judgement criterion to decide based on the variance values of rated power consumptions.

The EM algorism is one that sets the converged values obtained by the repeated convergence calculation to the estimation values of the averages and the estimation values of the variances. It costs very high, however, to execute the repeated convergence calculation until the values converge at each period at one minute intervals by using the total electric power usage and its jump amounts inputted at one minute intervals.

So, the embodiment uses the characteristics of the EM algorism having the monotonicity features of likelihood, a repeated calculation of the EM algorism is executed only one time, which is transferred to the next process.

When the calculation values are close to the values of rated power consumptions registered so far, its corresponding electrical appliance is judged to be switched on or off. The judgement whether or not it is close to the rated power consumptions depends on the variance values corresponding to the rated power consumptions.

Incidentally, a length of past data going back for calculating at the M-step is set shorter than that of the past data stored.

The variable k-means algorism with the variable number of clusters has explained above, and then a dynamic expression of the reverse estimation algorism for the NIALM will be explained below.

An aim of the real-time reverse estimation algorism for the NIALM is to estimate what types of the electrical appliances exist and what statuses they are, in based on the variation data (jump amounts and their up or down direction) of the total electric power at one minute intervals in an actual household environment. To achieve the aim, a system that dynamically processes data varying in time series is required. Further, only the real-time processing of time-serial data is not sufficient, and this processing needs to be combined with real-time control.

At this present time, a method called the state space modelling is known as the most effective one which dynamically processes time-series data in real time, combining it with control.

The method using the state space modelling is also called a Kalman filter method. The fundamental concept thereof consists of a state equation that represents time transient of state variables as latent variables and an observation equation that combines unobserved state variables with the observed data.

In the embodiment, the state equation is an equation representing a model relating a statistical estimation of what electrical appliance is switched on or off based on the jump of the first order difference of the total electric power.

The important matters about the state space modelling are: 1) how the state variable is defined, 2) the state equation that represents how the state transits in time, and 3) the observation equation that combines the state variables as unobserved latent variables with the observed variables.

Further, 4) when combining with control, an operator or an observer is required to input policy variables or control variables to a dynamic system represented by the state equation in addition to the state variables.

The real-time reverse estimation algorism for the NIALM of the embodiment is characterized in modelling that includes input variables to described in 4). That is, the modelling with the input variables of the embodiment uses a modelling grasped as eternal shock that changes the state of the dynamic system, not meaning a conventional meaning of the control variables. More generalizing in a broader way, it is a method where such an external learning input is capable of being treated similarly.

Herein, a standard form representing the Kalman filter is shown below.

Let the state variable vector at a $t^{th}$ period be expressed as $x_t$, the input vector as $u_t$, and the observation vector as $y_t$. Further, let the probability variable vector of an error term in the state equation be expressed as $W_t$, and the probability variable vector of an error term in the observation equation as $v_t$.

In the standard form, the state equation and the observation equation are respectively described as follows.

[Eq. 50]

$$x_t = F_{t-1} x_{t-1} + G_{t-1} u_{t-1} + w_{t-1} \quad (48)$$

[Eq. 51]

$$y_t = H_t x_t + v_t \quad (49)$$

where $F_t$, $G_t$, and $M_t$ are known coefficient matrixes.

Herein, the error term in the state equation or the error term in the observation equation is independent between different time points. In addition, it is supposed that the error term is the state equation is independent from that in the observation equation.

The above-described assumption is expressed as follows.

[Eq. 52]

$$E(w_t w_{t'}^T) = Q_t \delta_{n'} \qquad (50)$$

[Eq. 53]

$$E(v_t v_{t'}^T) = R_t \delta_{n'} \qquad (51)$$

[Eq. 54]

$$E(w_t v_{t'}^T) = 0 \qquad (52)$$

$\delta_{n'}$ is Kronecker's delta where it is 1 when t=t' and it is zero when t≠t'. In addition, 0 in the equation (52) is a zero matrix in an adequate size, and $Q_t$ and $R_t$ are known covariance matrixes.

A time suffix of the input vector relates to a description below, and so the following note is required. The time suffix of the input vector is expressed by t−1, but the equation (48) only means that an input is added under a given condition of the state variables at time t−1, thereby the state variables at time t being produced. That is, it is sufficient that the equation t−1≤s<t holds at input time s. Therefore, to be expressed as t−1 is an expedient expression, and so it might be t.

In addition, the time suffix of the error term is expressed by t, but it means that the error term is added to the state variables at time t−1, thereby the state variables at time t being produced. As the input vector is supposed to include no observation error, the input time s may be before or after the time when the error is added. So the input time is expressed as t in the following descriptions, but it is not substantially different from the equation (48).

Herein, a notation of a conditional probability described below is introduced. Then, the expression of recursive update of the Kalman filter can be simplified.

[Eq. 55]

$$\hat{x}_t^- = E(x_t | y_1, y_2, \ldots, y_{t-1}) \qquad (53)$$

[Eq. 56]

$$\hat{x}_t^+ = E(x_t | y_1, y_2, \ldots, y_{t-1}, y_t) \qquad (54)$$

That is, the upper right suffix "−" in the above equations indicates a conditional expected value when the observed values are given up to one period before the last one, the upper right suffix "+" indicates a conditional expected value when the observed values are given up to this period.

Similarly, the conditional expectation of the covariance matrix of the state variable vector are described in the similar expression.

[Eq. 57]

$$P_t^- = E[(x_t - \hat{x}_t^-)(x_t - \hat{x}_t^-)^T | y_1, y_2, \ldots, y_{t-1}] \qquad (55)$$

[Eq. 58]

$$P_t^+ = E[(x_t - \hat{x}_t^+)(x_t - \hat{x}_t^+)^T | y_1, y_2, \ldots, y_t] \qquad (56)$$

These equations are briefly described as follows.

[Eq. 59]

$$P_t^- = E[(x_t - \hat{x}_t^-)(x_t - \hat{x}_t^-)^T] \qquad (57)$$

[Eq. 60]

$$P_t^+ = E[(x_t - \hat{x}_t^+)(x_t - \hat{x}_t^+)^T] \qquad (58)$$

The both of $P_t^-$ and $P_t^+$ are error covariances of the state variable vectors.

The initial step is given as follows.

[Eq. 61]

$$\hat{x}_0^+ = E(x_0) \qquad (59)$$

[Eq. 62]

$$P_0^+ = E[(x_0 - \hat{x}_0^+)(x_0 - \hat{x}_0^+)^T] \qquad (60)$$

where a series of input $u_0, u_1, \ldots, u_t, \ldots$ is a problem, and the input series is, however, assumed to be given from the outside without errors.

The recursive update process as a main part of the Kalman filter is expressed as follows.

[Eq. 63]

$$\hat{x}_t^- = F_{t-1} \hat{x}_{t-1}^+ + G_{t-1} u_{t-1} \qquad (61)$$

[Eq. 64]

$$P_t^- = F_{t-1} P_{t-1}^+ F_{t-1}^T + Q_{t-1} \qquad (62)$$

[Eq. 65]

$$K_t = P_t^- H_t^T (H_t P_t^- H_t^T + R_t)^{-1} \qquad (63)$$

[Eq. 66]

$$\hat{x}_t^+ = \hat{x}_t^- + K_t (y_t - H_t \hat{x}_t^-) \qquad (64)$$

[Eq. 67]

$$P_t^+ = P_t^- - K_t H_t P_t^- \qquad (65)$$

The equation (63) is a term called as a Kalman gain.

A calculation procedure of the Kalman filter according to the above-described equation system becomes as follows.

1) First, the initial values ($\hat{x}_0^+$, $P_0^+$) are decided based on the equations (59) and (60).

2) Next, the predicted value $\hat{x}_t^-$ of the state variable vector and the error covariance Pt are calculated based on the observed values up to one period before by using the equations (61) and (62).

3) The Kalman gain in the equation (63) is computed.

4) The predicted value of the state variable vector is updated based on the observed values at this period by using the equation (64).

5) The error covariance of the state variable vector is updated by using the equation (66).

The above explanation describes about the concept of the state space modelling, the standard form of the Kalman filter, and the procedure of recursive calculation in the Kalman filter.

Next, the Kaman filter is actually applied to a construction of a real-time reverse estimation algorism for the NIALM.

The real-time reverse estimation algorism for the NIALM is one that identifies and estimates the types (having the respective rated power consumption) of the individual electrical appliances based on the time variations of the total electric power usage at one minute intervals to grasp the dynamic variations of the operation statutes of the individual electrical appliances in real time. In the embodiment, the method of the state space modelling is applied to the dynamic estimation of the operation statutes of the individual electrical appliances, and it is combined with the above-explained estimation algorism of the rated power consumptions of the individual electrical appliances.

The most main characteristics thereof are to incorporate the estimation results, which are obtained by the estimation algorism of the rated power consumptions of the individual electrical appliances, are used as inputs to the Kalman filter, being incorporated into the state equation representing the state transition of the operation statutes of the individual electrical appliances.

In order to treat the concrete dynamic estimation of the operation statutes of the individual electrical appliances, the following notations are introduced.

$Pw_t$: total electric power usage at the $t^{th}$ period $Pw_t^k$: electric power usage of a k-type electrical appliance at the $t^{th}$ period $P^k$: rated power consumption of the k-type electrical appliance $(\sigma^2)^k$: a variance of the rated power consumption of the k-type electrical appliance $P_t^{\sim k}$: an estimation value of the rated power consumption of the k-type electrical appliance in the $t^{th}$ period $(\hat{\sigma}^2)_t^k$: an estimation value of the variance of the rated power consumption of the k-type electrical appliance in the $t^{th}$ period The observed values are one-dimensional data of the total electric power usage observed at one minute intervals.

$$Y_t = Pw_t, t=1, 2, \ldots$$

Incidentally, the notation of $y_t$ is used to adjust a notation of the standard form of the Kalman filter.

The state variable vector naturally needs to represent the operation statues of the individual electrical appliances because the aim of the real-time reverse estimation algorism for the NIALM is to dynamically estimate the operation statues of the individual electrical appliances. In order to make it more clear, the latent probability variables where the operation statues become on or off are defined as follows.

The state probability variable representing the operation statuses of the k-type electrical appliance is expressed by $x_t^k$. The state probability variable $x_t^k$ is defined as follows.

[Eq. 68]

$$X_t^k = \begin{cases} 1 & \text{The } k\text{-sort electrical appliance is ON at the time point } t \\ 0 & \text{otherwise} \end{cases} \quad (66)$$

Herein, the predicted value $x_t^k$ of the state probability variable is computed as follows.

[Eq. 69]

$$x_t^k = E(X_t^k) = 1 \cdot P(X_t^k = 1) + 0 \cdot P(X_t^k = 0) \quad (67)$$
$$= P(X_t^k = 1)$$

It is understood from the above-described equation that the predicted value $x_t^k$ becomes the operation probability of the k-type electrical appliance. So let the expression dare to be misused, and it is assumed that the predicted value $x_t^k$ of the state probability variable is a state variable, so that the state variable vector is regarded to indicate the operation probability of the each electrical appliance. The type 0, however, indicates the total electric power usage, being also as a state variable.

The summary of the above-described explanation is as follows.

$x_t^0$: a predicted value of the total electric power usage (the same as an observed value) $X_t^0 = Pw_t$ $x_t^k$ (k=1, 2, ..., $k_t$): an operation probability of the k type electrical appliance, where $k_t$ is the number of types of the individual electrical appliances estimated up to the $t^{th}$ period $\Omega_t$: a type list of the entire electrical appliances estimated up to the $t^{th}$ period, that is $\Omega_t=(1, 2, \ldots, k_t)$ $B_t$: a list of the estimation values of the rated power consumption $P^k$ and the variances $(\sigma^2)_t^k$ of the entire electrical appliances estimated up to the $t^{th}$ period, that is $$\Lambda_t = \{(P_t^1, (\sigma^2)_t^1), (P_t^2, (\sigma^2)_t^2), \ldots, (P_t^{k_t}, (\sigma^2)_t^{k_t})\} \quad [\text{Eq. 70}]$$

Therefore, $k_t = |\Omega_t|$ where $|S|$ is the number of elements belonging to the class $S$.

The main characteristics of the reverse estimation algorism of the embodiment is that the jumps of the total electric power usage as the time variation at one minute intervals are incorporated into the input variables of the Kalman filter.

However, the jumps are not inputted as they are, being different from the standard form of the Kalman filter in the following point. That is, it is judged what electrical appliance, in the class $\Omega_t$ of the possessed electrical appliances existing in the type list, corresponds to the occurrence of the operation statues if the jump occurs, and they are converted to the input vector for each state variable by using the k-means modelling.

First, the jumps as the first order differences of the total electric power usage are used as scalar input variables, which corresponds to the state variable $x_t^0$ of the total electric power usage.

[Eq. 71]

$$u_t^0 = X_t^0 - X_{t-1}^0 \quad (68)$$

Ordinarily, the input variables are treated to have no errors, so that $u_t^0 = E(u_t^0)$. Therefore, the following equation holds.

[Eq. 72]

$$u_t^0 = E(X_t^0) - E(X_{t-1}^0) = x_t^0 - x_{t-1}^0 \quad (69)$$

Hereinafter, the input variables will be treated without distinction from the expected values.

Then, the input variables $u_t^k$, k=1, ..., $k_t$ into the state variables corresponding to the $k_t$ type electrical appliances are defined.

They are defined by probability distributions of the types of the $k_t$ type electrical appliances which represents the change of the operation status of what electrical appliance the jump $u_t^0$ is generated from. A conventional definition about the input variables $u_t^k$, k=1, ..., $k_t$ will be described below, but a meaning thereof will be explained at another time. They are regarded as input vectors corresponding to $k_t$ number of the statuses for the nonce.

The $k_t+1$ number of the input variables are gathered together, being expressed by a vector $u_t$.

[Eq. 73]

$$u_t = (u_t^0, u_t^1, \ldots, u_t^{k_t}) \quad (70)$$

Under the above-described preparation, the state equation is constituted. In order to do so, a description is required about how xtk is generated from xt-lk and utk in terms of ktk, (k=0, 1, . . . , k) k+1 number of state variables 1) Decision of $u_t^0$ and $x_t^0$

[Eq. 74]

$$u_t^0 = \Delta y_t = y_t - y_{t-1} = Pw_t - Pw_{t-1} \tag{71}$$

[Eq. 75]

$$x_t^0 = x_{t-1}^0 + u_t^0 \tag{72}$$

From this definition, a series of the state variables xt0 become the same as those of the total electric power Pwt (the observed value yt). The equations (71) and (72) concretely represent a modelling, focusing on the jumps of the total electric power usage.

2) Decision of $u_t^k$, (k=1, . . . , $k_t$) and $x_t^k$, (k=1, . . . , $k_t$)

(a) $nzu_t^k$, (k=1, . . . , $k_t$) is decided by using the following equation.

[Eq. 76]

$$nzu_t^k = \phi(|u_t^0|\,|\,P_t^k, \sigma_t^k)\pi_t^k \Big/ \sum_{k=1}^{k_t} \phi(|u_t^0|\,|\,P_t^k, \sigma_t^k)\pi_t^k \tag{73}$$

where $\Phi(x|u_t, \sigma)$: a density function of the normal distribution $N(\mu, \sigma^2)$ of the average $\mu$ and the standard deviation $\sigma$ $|u_t^0|$: an absolute value of $u_t^0$ $\pi_t^k$, k=1, . . . , $k_t$: a prior distribution (cf. the equation (43)) corresponding to $k_t$ number of hypothesis $N(\mu_t^k, (\sigma^2)_t^k)$ The equation (73) represents the probability judging what type the jump of the total electric usage is generated from.

(b) Decision of the state variable $x_t^k$, k=1, . . . , $k_t$ (the state equations when k=1, . . . , $k_t$, except that when k=0)

The following equation represents the state equation (k=1, . . . , $k_t$) except that at k=0.

[Eq. 77]

$$\begin{cases} u_t^0 > 0, & x_t^k = x_{t-1}^k + (1 - x_{t-1}^k)nzu_t^k + w_t^k \quad k = 1, \ldots, k_t \\ u_t^0 < 0, & x_t^k = x_{t-1}^k - x_{t-1}^k nzu_t^k + w_t^k \quad k = 1, \ldots, k_t \\ u_t^0 = 0, & x_t^k = x_{t-1}^k + w_t^k \quad k = 1, \ldots, k_t \end{cases} \tag{74}$$

Herein, $u_t^k$, (k=1, . . . , $k_t$) is defined by the following equation.

[Eq. 78]

$$u_t^k = \begin{cases} (1 - x_{t-1}^k)nzu_t^k & \text{if } u_t^0 > 0 \\ -x_{t-1}^k nzu_t^k & \text{if } u_t^0 < 0 \\ 0 & \text{if } u_t^0 = 0 \end{cases} \tag{75}$$

$k = 1, \ldots, k_t$

The following equation comes to the standard form of the Kalman filter.

[Eq. 79]

$$\begin{cases} u_t^0 > 0, & x_t^k = x_{t-1}^k + u_t^k + w_t^k \quad k = 1, \ldots, k_t \\ u_t^0 < 0, & x_t^k = x_{t-1}^k + u_t^k + w_t^k \quad k = 1, \ldots, k_t \\ u_t^0 = 0, & x_t^k = x_{t-1}^k + w_t^k \quad k = 1, \ldots, k_t \end{cases} \tag{76}$$

3) Decision of the observation equation

[Eq. 80]

$$y_i = \sum_{k=1}^{k_t} P_t^k x_t^k + v_t \tag{77}$$

As $P_t^k x_t^k$, (k=1, . . . , $k_t$) is a product of the rated power consumption $P_t^k$ of the k type electrical appliance and the operation probability $x_t^k$, it corresponds to a predicted value of the electric power use at the $t^{th}$ period of the k type electrical appliance. In addition, $\Sigma k_{=1}^{kt} P_t^k x_t^k$ becomes a predicted value of the total electric power usage. This value does not always correspond to the observed value $y_t$ of the total electric power usage. Incidentally, $v_t$ is an error term in the above-described equation.

As stated above, the equations (71) and (72) constitute the state equation, and the equation (77) is an observation equation, the real-time reverse estimation algorism can be resulted in the standard form of the Kalman filter by the state space modelling.

To state more accurately, the standard form of the Kalman filter is that of the following linear form, which is reshown below.

[Eq. 81]

$$x_i = F_{i-1} x_{t-1} + G_{i-1} u_t + w_t \tag{78}$$

As it is apparent from the above-described description, the total electric power usage $u_t^0$ is not directly substituted into the equation (48), and $k_t$ number of the input $u_t^k$, (1, . . . , $k_t$), which is nonlinear-transformed by the equation (73), is substituted into $k_t$ number of the state transition equation expressed by the equation (48). So it constitutes substantially a nonlinear Kalman filter.

The equations (48) and (76) are a main part of an interrogation (combination) of the k-means model and the Kalman filter. The equation (73), corresponding to the area B in FIG. 3, provides a process that calculates about how the output from the k-means algorism is converted to the input of the Kalman filter.

On the other hand, the equation (74), corresponding to the Markov switching in the area C-1 in FIG. 3, provides a process that calculates about how the state variable is changed by the above input.

Next, these calculation processes will be in detail explained.

First, the equation (73), which converts the output of the k-means into the input of the Kalman filter, will be described.

In a flow of the calculation in the t-th k-means model, it is judged whether or not a new type of electric appliance is added to the existing type list, and then the rated power consumptions and variances thereof within a new type list are recalculated by using the EM algorithm, the overlapping type being deleted if any.

Accordingly, the output from a block of the area A in FIG. 3 is the number of the types of the latest individual electrical appliances at the $t^{th}$ period, and the rated power consumptions of the individual electrical appliances and estimation values of the variances of the rated power consumptions. Using terms of k-means model, they are the averages and the variances of the $k_t$ number (the latest type number) of normal distributions at the $t^{th}$ period. Using terms of NIALM, they are the estimation values $P_t^k$ of the rated power consumptions $P_k$ of the electrical appliances and the estimation values $(\sigma^2)_t^k$ of the variances $(\sigma^2)^k$.

So, it becomes possible to judge what normal distribution in the $k_t$ number of normal distributions $N(\mu_t^k, (\sigma^2)_t^k)$, $k=1, \ldots, k_t$ the sample from corresponds to if the jump $u_t^0$ of the total electric power usage occurs.

In other words, when the jump $u_t^0$ of the total electric power usage is given, it becomes possible to judge, with measuring, about the change of the operation statue of what electrical appliance in the $k_t$ number of the electrical appliances the jump $u_t^0$ is generated from.

The jump $u_t^0$ of the total electric power usage is positive and negative, while the amplitude of the rated power consumption and its variance are positive, so that the jump is calculated according to the equation (44) by computing the absolute value $|u_t^0|$ and using the concept of the k-means model.

The equation (73) is written again, where $u_t^k$ is expressed as $nzu_t^k$, $k=1, \ldots, k_t$ as shown in the equation (78) in order to clearly written so that it is normalized.

[Eq. 82]

$$nzu_t^k = \phi(|u_t^0| | P_t^k, \sigma_t^k)\pi_t^k / \sum_{k=1}^{k_t} \phi(|u_t^0| | P_t^k, \sigma_t^k)\pi_t^k \quad (78)$$

$$k = 1, \ldots, k_t$$

where $\Phi(x|\mu, \sigma)$: a density function of a normal distribution $N(\mu, \sigma^2)$ with an average $\mu$ and a standard variance $\sigma$
$|\mu_t^0|$: an absolute value of $u_t^0$
$\pi_t^k$, $k=1, \ldots, k_t$: a prior distribution for $k_t$ number of hypotheses (cf. the equation (44))
$nzu_t^k$ ($k=1, \ldots, k_t$) becomes a posterior distribution in a case where $u_t^0$ is observed when the prior distribution is $\pi_t^k$ ($k=1, \ldots, k_t$).

Herein, consider how the operation statuses of the existing individual electrical appliances should be changed when the jump $u_t^0$ of the total electric power usage at the $t^{th}$ period is observed.

In the development of the reverse estimation algorism of the embodiment, it stands on the premise that the number of times of the events in which the two electrical appliances switched on or off at the same time is supposed to become smaller when the total electric power usage is measured at a short time intervals. In addition, it is also supposed that the number of times of the events in which a plenty of electrical appliances are switched on or off at the same time also becomes small.

Under these suppositions, it is natural that the jump $u_t^0$ of the total electric usage at the $t^{th}$ period is generated from the change of switching on and off causing in any one of the $k_t$ types of electrical appliances.

Therefore, $u_t^0 > 0$ ON change of any one of 1-$k_t$ electrical appliances $u_t^0 > 0$ OFF change of any one of 1-$k_t$ electrical appliances $u_t^0 = 0$ no change [Eq. 83]

A problem is to estimate what electrical appliance in $k_t$ number of the electrical appliances generated its change. To estimate that, the concept of the k-means model is applied as described above. Its result is $nzu_t^k$, $k=1, \ldots, k_t$, being a posterior probability in which the on/off change is generated from the corresponding electrical appliance.

Although the probability of the occurrence of the change of what electrical appliance in the $k_t$ number of electrical appliances is estimated by $nzu_t^k$, $k=1, \ldots, k_t$ when $u_t^0$ is given, it is not clear how it changes the state variable.

The reason being that how the state variable changes is different according to the value $x_{t-1}^k$ of the state variable at the $t-1^{th}$ period before the change occurs. A model, where how the state transits at the $t-1^{th}$ period becomes different according to a difference of the state at the $t-1^{th}$ period, is generally called as a Markov Switching Model.

In the real-time reverse estimation algorism for the NIALM of the embodiment, the concept of the Markov switching model is applied to the state transition.

Hereinafter, the above application will be explained.

A case of $u_t^0 > 0$: FIG. 5 shows a table that puts the state changes together in the case of $u_t^0 > 0$.

Since $u_t^0 > 0$, any one of $k \sim 1, \ldots, k_t$ electrical appliances is supposed to be switched to on. This change, however, is different according to the value of the state variable $X_{t-1}^k$ at the $t-1^{th}$ period.

The change can be generally expressed in a form of a transition probability as shown in the table in FIG. 5. That is, in a case where the value of $x_{t-1}^k$ at the $t-1^{th}$ period is 0, the transition probabilities in which $x_t^k$ changes to 0, 1 at the $t^{th}$ period are shown as $P_{00}$, $P_{01}$, respectively. Similarly, in a case where the value of $x_{t-1}^k$ at the $t-1^{th}$ period is 1, the transition probabilities in which $x_t^k$ changes to 0, 1 at the $t^{th}$ period are shown as $P_{10}$, $P_{11}$, respectively.

In the case where $u_t^0 > 0$, any one of the electrical appliances has changed to be on, it should be supposed that no change occurs in the type in which the value of $x_{t-1}^k$ at the $t-1^{th}$ period is 1, namely the electrical appliances that have been already switched on, so that $P_{11}=1$, $P_{10}=0$ are written in the table in FIG. 5 in order to express the above description.

On the other hand, the type in which the value of $x_{t-1}^k$ at the $t-1^{th}$ period is 0 has a possibility where the change to switched-on occurs, that is, $x_t^k$ at the $t^{th}$ period changes to 1, so that it is an idea of the model so as to judge the probability $P_{01}$ by $nzu_t^k$.

According to this idea, the transition probability is supposed as follows.

[Eq. 84]

$p_{01} = P(X_t^k = 1 | X_{t-1}^k = 0) = nzu_t^k$ $p_{00} = 1 - nzu_t^k$ (79)

[Eq. 85]

$p_{11} = P(X_t^k = 1 | X_{t-1}^k = 1) = 1$ $p_{10} = 0$ (80)

From the above, a probability where the state of $x_t^k$ becomes 1 by a Markov chain, that is, the k-type electrical appliance is switched on at the $t^{th}$ period is mathematically formulated as follows,

[Eq. 86]
$$P(X_t^k=1)=(X_{t-1}^k=0)p_{01}+P(X_{t-1}^k=1)p_{11} \quad (81)$$

Focusing on that the expected value of the probability variable represents a probability, the equations (82) to (85) hold.

[Eq. 87]
$$x_t^k=E(X_t^k) \quad (82)$$

[Eq. 88]
$$P(X_t^k=1)=E(X_t^k)=x_t^k \quad (83)$$

[Eq. 89]
$$P(X_t^k=1)=E(X_{t-1}^k)=x_{t-1}^k \quad (84)$$

[Eq. 90]
$$P(X_{t-1}^k=0)=1-x_{t-1}^k \quad (85)$$

Finally, using the above-described relationships, the equation (82) becomes a state equation as follows.

[Eq. 91]
$$x_t^k=(1-x_{t-1}^k)nzu_t^k+x_{t-1}^k+w_t^k \quad (86)$$

[Eq. 92]
$$x_t^k=x_{t-1}^k+(1-x_{t-1}^k)nzu_t^k+w_t^k \quad (87)$$

So, let the input variable be as follows anew.

[Eq. 93]
$$u_t^k=(1-x_{t-1}^k)nzu_t^k \quad (88)$$

Then, it can be expressed below in a linear normal form.

[Eq. 94]
$$x_t^k=x_{t-1}^k+u_t^k+w_t^k \quad (89)$$

Similarly, in a case where $u_t^0<0$, the following equations hold. FIG. 6 show a table that put the state changes together in a case of $u_t^0<0$.

As shown in the table in FIG. 6, the transition equation is supposed as follows.

[Eq. 95]
$$p_{10}=P(X_t^k=0|X_{t-1}^k=1)=nzu_t^k$$
$$p_{11}=1-nzu_t^k \quad (90)$$

[Eq. 96]
$$p_{01}=P(X_t^k=1|X_{t-1}^k=0)=0$$
$$p_{00}=1 \quad (91)$$

A probability where the state of $x_t^k$ is 0 by the Markov chain, that is, the k-type electrical appliance is switched off is mathematically formulated as follows.

[Eq. 97]
$$P(X_t^k=0)=P(X_{t-1}^k=0)p_{00}+P(X_{t-1}^k=1)p_{10} \quad (92)$$

On the other hand, the state equation becomes as follows.

[Eq. 98]
$$1-x_t^k=(1-x_{t-1}^k)+x_{t-1}^k nzu_t^k+w_t^k \quad (93)$$

[Eq. 99]
$$x_t^k=x_{t-1}^k-nzu_t^k x_{t-1}^k+w_t^k \quad (94)$$

Then, let the input variable $u_t^k$ be as follows anew.

[Eq. 100]
$$u_t^k=-nzu_t^k x_{t-1}^k \quad (95)$$

It can be expressed as follows.

[Eq. 101]
$$x_t^k=x_{t-1}^k+u_t^k+w_t^k \quad (96)$$

Further, in a case where $u_t^0=0$, the following equation hold.

[Eq. 102]
$$p(X_t^k=X_{t-1}^k)=p(u_t^k=0)=1 \quad (97)$$

That is, the transition probabilities become $P_{00}=1$, $P_{11}=1$.
Therefore, the state equation is given by the following equation.

[Eq. 103]
$$x_t^k=x_{t-1}^k+w_t^k \quad (98)$$

The state equation of the Kalman filter can be introduced from the above equations. In the Markov switching model, the state equation cannot be expressed by a form of single equation, but it is expressed by a form of a plurality of equations according to state variations at the t−1$^{th}$ period and cases of the jump of the total electric power usage being positive, negative or 0. Further, normally, the dimension of the state variable vector does not vary, being fixed, in the Kalman filter. However, in the reverse estimation algorism of the embodiment, the types of the individual electrical appliances and the rated power consumptions thereof are estimated in real time on the way of elapsed time, so that the number of the types varies over time. Therefore, the dimension of the state variable vector representing the state estimation varies over time, which causes an explored issue such as a transfer of the variables when the dimension of the state variable vector varies.

Next, a process that recursively updates the optimal estimation of the state variables of the Kalman filter will be explained by using the observed values of the total electric power usage and the state equation formulated by the Markov switching model.

This process corresponds to the area C-2 in FIG. 3. The state variables to of the model are operation probabilities of the estimated individual electrical appliances, so that the optimal estimation of the operation states of the individual electrical appliances are kept been updating at any time based on the observed values of the total electric power usage.

The algorism that recursively updates the state variables is a main part of the Kalman filter. Its calculation process has been already described as the equations (61)-(65) representing the normal form of the Kalman filter.

The Kalman filter is an expansion of the least square method in two meanings.

A first point is to treat unknown parameter β as a probability variable to calculate the estimated value of its minimum variance and have prior information relating to its covariance in advance at an initial point of time in the normal least square method.

A second point is an issue about how the estimated value of β obtained so far is updated when newly observed values are successively inputted in the least square method, and it is to successively keep updating by adding a part contributing to an orthogonal component in a space constituted by the estimated values obtained so far, which newly observed values, to the existing estimated values. The issue of the second point is expressed in the updating algorism of the state variable using a term called as the Kalman gain in the Kalman filter.

Then, the calculation process will be transformed into matrix forms one by one.

First, the initial values $x_0^{\hat{}+}$, $P_0^+$ are given. Further, the error covariance $Q_t$, t=0, 1, ... of the state equation and the error covariance $R_t$, t=0, 1, 2, ... of the observation equation are given from the outside. The state variable and its covariance matrix $x_0^{\hat{}+}$, $P_0^+$ are sequentially kept being updated inside since t−1$^{th}$ period, while Qt and Rt are given from the outside at all periods.

Next, it is important to distinguish a suffix of + from that of −, which are positioned at upper right side of the state variable. They are rewritten below.

[Eq. 104]

$$\hat{x}_t^- = E(x_t | y_1, y_2, \ldots, y_{t-1}) \tag{53}$$

[Eq. 105]

$$\hat{x}_t^+ = E(x_t | y_1, y_2, \ldots, y_{t-1}, y_t) \tag{54}$$

(cf. the equations (53) and (54))

$x_t^{\hat{}-}$ is an estimated value that estimates the state variable $x_t$ at the t$^{th}$ period based on the information up to the t−1$^{th}$ period. On the other hand, $x_t^{\hat{}+}$ is an estimated value that estimates the state variable $x_t$ at the t$^{th}$ period based on the information up to the t$^{th}$ period.

The algorism at the t$^{th}$ period of the Kalman filter is a sequential calculation process where, when $x_{t-1}^{\hat{}+}$ and $P_{t-1}^{\hat{}+}$ are given, the input $u_{t-1}$ is obtained to output $x_{t-1}^{\hat{}+}$ and $P_t^+$ by sequentially calculating so as to connect them to the next calculation at the t+1$^{th}$ period. First, the expected value $x_t^{\hat{}-}$ is calculated as follows by using the state equation based on the input $u_{t-1}$. (cf. the equation (48))

[Eq. 106]

$$x_t = F_{t-1} x_{t-1} + G_{t-1} u_{t-1} + w_{t-1} \tag{48}$$

The reverse estimation algorism is written in a matrix form, which is shown below, because $F_{t-1}$ and $G_{t-1}$ are unit matrixes.

[Eq. 107]

$$\begin{pmatrix} \hat{x}_t^{0-} \\ \hat{x}_t^{1-} \\ \vdots \\ \hat{x}_t^{k_t-} \end{pmatrix} = \begin{pmatrix} 1 & 0 & \ldots & 0 \\ 0 & 1 & & 0 \\ \vdots & & \ddots & \vdots \\ 0 & 0 & \ldots & 1 \end{pmatrix} \begin{pmatrix} \hat{x}_{t-1}^{0+} \\ \hat{x}_{t-1}^{1+} \\ \vdots \\ \hat{x}_{t-1}^{k_t+} \end{pmatrix} + \begin{pmatrix} 1 & 0 & \ldots & 0 \\ 0 & 1 & & 0 \\ \vdots & & \ddots & \vdots \\ 0 & 0 & \ldots & 1 \end{pmatrix} \begin{pmatrix} u_{t-1}^0 \\ u_{t-1}^1 \\ \vdots \\ u_{t-1}^{k_t} \end{pmatrix} \tag{99}$$

Next, the estimated value $P_t^-$ of the covariance $P_t$ of the state variable $x_t$ is computed based on the information up to the t−1$^{th}$ period according to the state equation (62) of the state equation.

[Eq. 108]

$$P_t^- = F_{t-1} P_{t-1}^+ F_{t-1}^T + Q_{t-1} \tag{62}$$

Further, the Kalman gain is computed by using the following equation.

[Eq. 109]

$$K_t = P_t^- H_t^T (H_t P_t^- H_t^T + R_t)^{-1} \tag{63}$$

where $H_t$ is a vector consisting of the rated power consumptions of the individual electrical appliances estimated until the time point of t, and it is concretely expressed as follows.

[Eq. 110]

$$H_t = (P_t^0 P_t^1 \ldots P_t^{k_t}) \tag{100}$$

Next, the observed values at the t$^{th}$ period, that is, the total electric power usage $P_{wt}$ is measured, and the state variable $x_t^{\hat{}-}$ are updated by using the Kalman gain on the basis of error $y_t - H_t x_t^{\hat{}-}$ between the expected value $H_t x_t^{\hat{}-}$ of the total electric power usage at the t$^{th}$ period and the observed values, by sum of products of the operation state $x_t^{\hat{}-}$ of the individual electrical appliances at the t$^{th}$ period using the information up to the t−1$^{th}$ period and the rated power consumptions $P_t^k$ of the individual electrical appliances at the t$^{th}$ period. Then, the expected value $x_t^{\hat{}+}$ of the state variable $x_t$ using the information up to the t$^{th}$ period is calculated by the following equation.

[Eq. 111]

$$\hat{x}_t^+ = \hat{x}_t^- + K_t (y_t - H_t \hat{x}_t^-) \tag{101}$$

This equation is expressed in a matrix form as follows.

[Eq. 112]

$$\begin{pmatrix} \hat{x}_t^{0+} \\ \hat{x}_t^{1+} \\ \vdots \\ \hat{x}_t^{k_t+} \end{pmatrix} = \begin{pmatrix} \hat{x}_t^{0-} \\ \hat{x}_t^{1-} \\ \vdots \\ \hat{x}_t^{k_t-} \end{pmatrix} + \begin{pmatrix} K_t^0 \\ K_t^1 \\ \vdots \\ K_t^{k_t} \end{pmatrix} \left( y_t - \begin{pmatrix} P_t^0 & P_t^1 & \ldots & P_t^{k_t} \end{pmatrix} \begin{pmatrix} \hat{x}_t^{0-} \\ \hat{x}_t^{1-} \\ \vdots \\ \hat{x}_t^{k_t-} \end{pmatrix} \right) \tag{102}$$

Finally, the expected value of the minimum covariance matrix P of the estimator of the state variable are updated from the estimated values $P_t^-$ using the information up to term t−1 to the estimated values $P_t^+$ using the information up to the t$^{th}$ period by using the following equation.

[Eq. 113]

$$P_t^+ = P_t^- - K_t H_t P_t^- \tag{103}$$

By the above-described process, $x_t^{\hat{}+}$, $P_t^+$ and $H_t$ are outputted as the outputs at the t$^{th}$ period, which transits to the t+1$^{th}$ period. This is a calculation process at the t$^{th}$ period of the Kalman filter.

Figure 7:
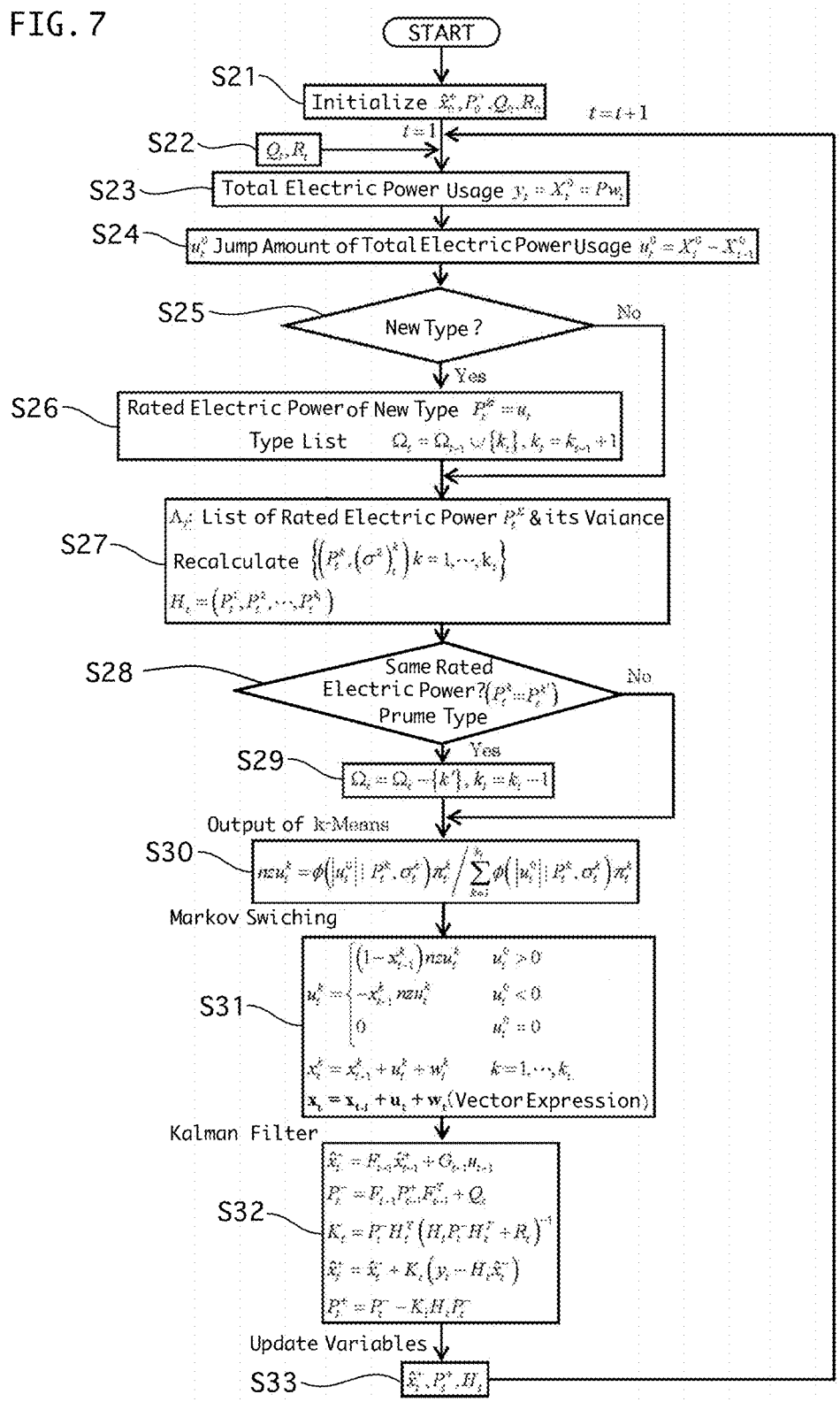
FIG. 7 is a flowchart, accompanied with mathematical formulas, showing a flow of a process estimating the operation statuses of the individual electrical appliances and performed by the individual electric-appliance operation-status estimation device of the embodiment.

FIG. 7 shows a flowchart of the entire calculation processes in the real-time reverse estimation algorism for the NIALM of the embodiment, which has been explained so far.

Herein, an outline will be given below about the flow of the real-time reverse estimation algorism with reference to FIG. 7, which is summarized again.

1) The initial values are given. They include the operation probability $x_0^{\hat{}+}$ of the individual electrical appliances, their covariance $P_0^+$, the error covariance $Q_t$, t=0, ..., of the state equation and the error covariance $R_t$, t=0, ..., of the observation equation. The error covariance of the state equation and the observation equation is given from the outside at all periods.

2) It is judged by the k-means algorism whether the jump of the total electric power corresponds to the rated power consumption of the electrical appliances existing so far. If it is a new jump, it is added to the type list as a new electrical appliance and its rated power consumption is temporally registered as rated power consumption of the new type.

3) The rated power consumption and variance of the electrical appliances registered in the type list are recalculated, including the type and the rated power consumption of the individual electrical appliances that are temporally registered. If the recalculation result of the rated power consumption can be regarded to be the same between the types of the existing appliances or between the new type and the existing type(s), the new electrical appliance is deleted from the type list. Thereby, the type list and a rated power consumption list of the individual electrical appliances are updated to the latest lists.

4) The probability of the occurrence is calculated in which the jump of the total electric power is generated due to a change of the operation status of which electrical appliance and that with which rated power consumption, which are registered in the latest type list and the latest rated power consumption list, respectively.

5) A Markov switching model is constituted so that it becomes different in the state transition according to the jump of the total electric power being positive, negative or 0. Further, a state equation is mathematically formulated so that it becomes different in the state transition to the $t^{th}$ period according to the difference of the operation statuses of the individual electrical appliances at the $t-1^{th}$ period.

6) The total electric power at the $t^{th}$ period is predicted by using an operation probability of the individual electrical appliances obtained from the information up to the $t-1^{th}$ period and the information on estimate value of the rated power consumptions of the individual electrical appliances at the $t^{th}$ period. Based on the error between the estimated value and the observed value of the total electric power at the $t^{th}$ period, the Kalman filter recursively updates the optimal estimation of the state variable and the covariance matrix of the state variable to output the operation probability $x_t^+$ and the covariance matrix $P_t^+$ of the individual electrical appliances at the $t^{th}$ period by using the information up to the $t^{th}$ period.

The real-time reverse estimation algorism of the embodiment has the characteristics and significances of:

1) focusing on the first order difference of time variation of the total electric power usage, namely the jump, 2) simplifying the identification of the types of the electrical appliances based on the difference of the rated power consumptions, 3) enabling to identify and estimate the types at one minute intervals and in real time by using the EM algorism, regarding the jumps as the input to the variable k-means model where the number of clusters varies, 4) enabling the dynamic and real-time estimation of the change of the operation status of the identified individual electrical appliances by combining the variable k-means model and the Kalman filter of the state space model, and 5) using the concept of the Markov switching in order to combine the k-means model and the Kalman filter.

Thus, the reverse estimation algorism of the embodiment is an unprecedented one with a high practicability in implementation to enable the dynamical and real-time estimation.

The real-time reverse estimation algorism of the embodiment was applied to an actual household environment data, and it was evaluated. The actual application to the household environment data is carried out as follows.

The NIALM was installed in an actually living environment (inside Tokyo city) for eight days (Mar. 12, 2013-Mar. 19, 2013), where the total electric power usage was observed and it was tested whether the types and the rated power consumptions of the individual electrical appliances could be estimated. The NIALM uses a quasi-household environment and the same device as that used in research, collecting data at every one second. The household that co-operated in the experiment was a family of four persons including two children. The weather during the experimental term is shown in FIG. 8.

In the embodiment, supposing that the device of the embodiment becomes widely used in the future, it used 11520 number of data at one minute intervals for eight days.

The evaluation results are shown in FIGS. 9-16.

FIG. 9 represents a frequency distribution by scale of jumps of the total electric power usage during one minute intervals. As it is apparent from FIG. 9, the observed jumps spreads out in a positive direction and a negative direction symmetrically to the center around 0. Therefore, there is a high possibility where the jumps of the total electric power usage correspond to switching on or off of the electrical appliances and the jumps correspond to the rated power consumptions.

An application item of the reverse estimation algorism constituted in the embodiment is assumed to be data on time variations at one minute intervals of the total electric power usage in an actual household environment. Especially, it focusses on the jumps, namely the first order differences of the time variation data of the total electric power usage during one minute intervals, and the jumps are treated as an input stream of the reverse estimation algorism.

It is an idea that positive jumps of rated power consumptions are generated when the individual electrical appliances are switched on and then negative jumps are generated and the electric power usage of the individual electrical appliances become 0 when the individual electrical appliances are switched off at any other time. This employs a method that focusses on the change of on and off events of the jumps, not going into waveforms of the total electric power usage like the technology disclosed by the patent reference 1.

Figure 10:
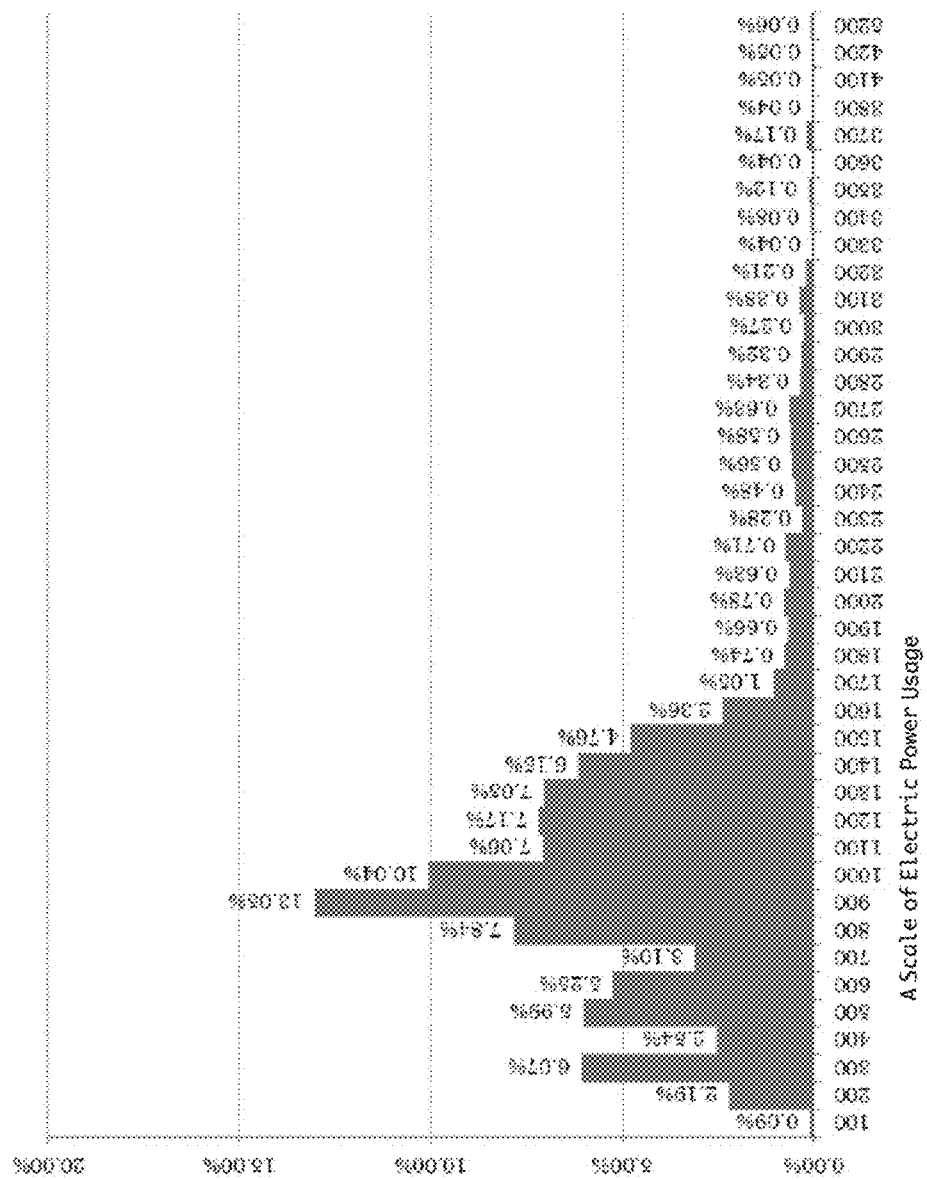
FIG. 10 is a diagram showing rates of total electric power consumption scales in the total electric power consumption obtained in the experiment.

FIG. 10 represents the rates of the total electric power usage by scale of jump during one minute intervals. Summing up the usage thereof, the total electrical usage becomes 8,941,000 Win. Converting this amount into the total electric power usage per one month, it becomes 558.8 kWh/month (=8941 kWm÷60 minutes÷8 days×30 days). This is close to a value of the electric power usage per one household in Japan, 544 kWh/month (cf. March 2013 "Family Income and Expenditure Survey" published by Japanese Ministry of Public Management), so that this family consumed the electric power usage similarly to the average one. Therefore, it reveals that this household in the experiment was suitable for the subject of the experiment of the electric power estimation by the NIALM.

Figure 11:
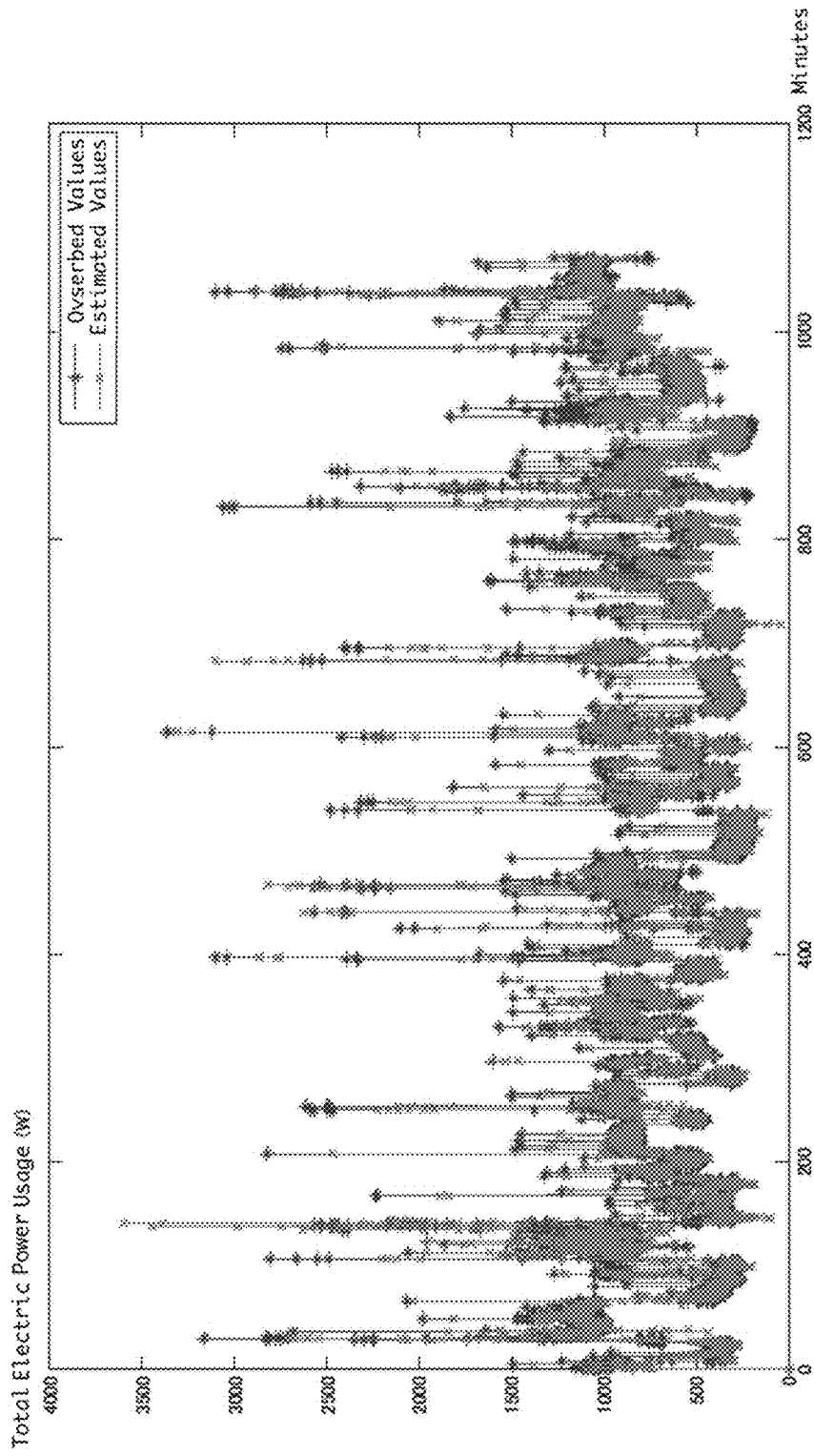
FIG. 11 is a diagram showing the results obtained by a real-time processing algorism using data for eight days (from the beginning of the usage to 11,520 minutes) in an actual household environment.

FIG. 11 represents the result obtained by the real time processing algorism using the experimental environment data during eight days (from the beginning of use up to 1,200 minutes). In FIG. 11, a horizontal axis represents time and a vertical axis represents total electric power usage.

Incidentally, transformation of the state variables is not transferred in this algorism.

Figure 12:
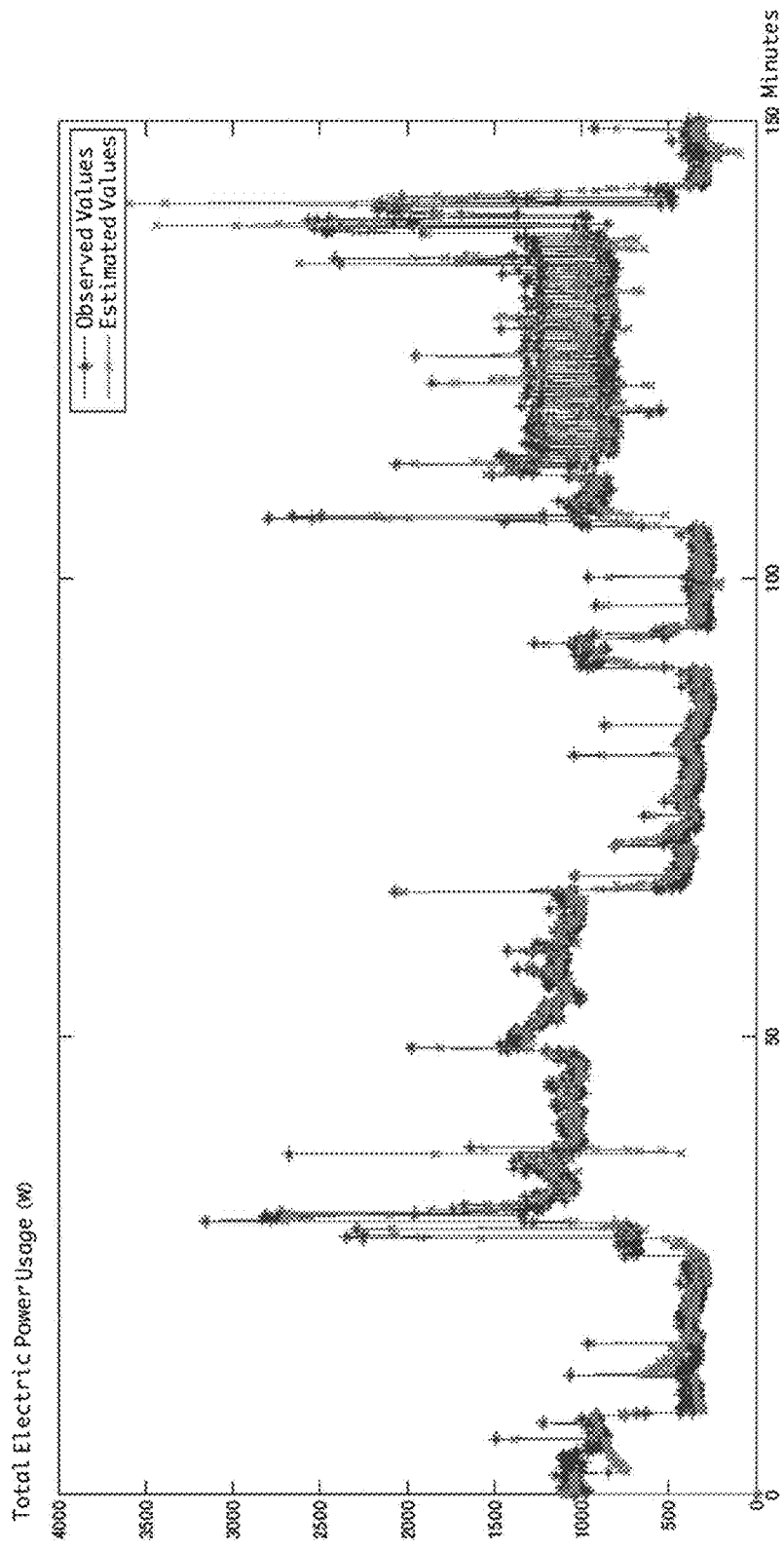
FIG. 12 is an enlarged diagram showing a part from the beginning of the use to 150 minutes in the results shown in FIG. 11.
Figure 13:
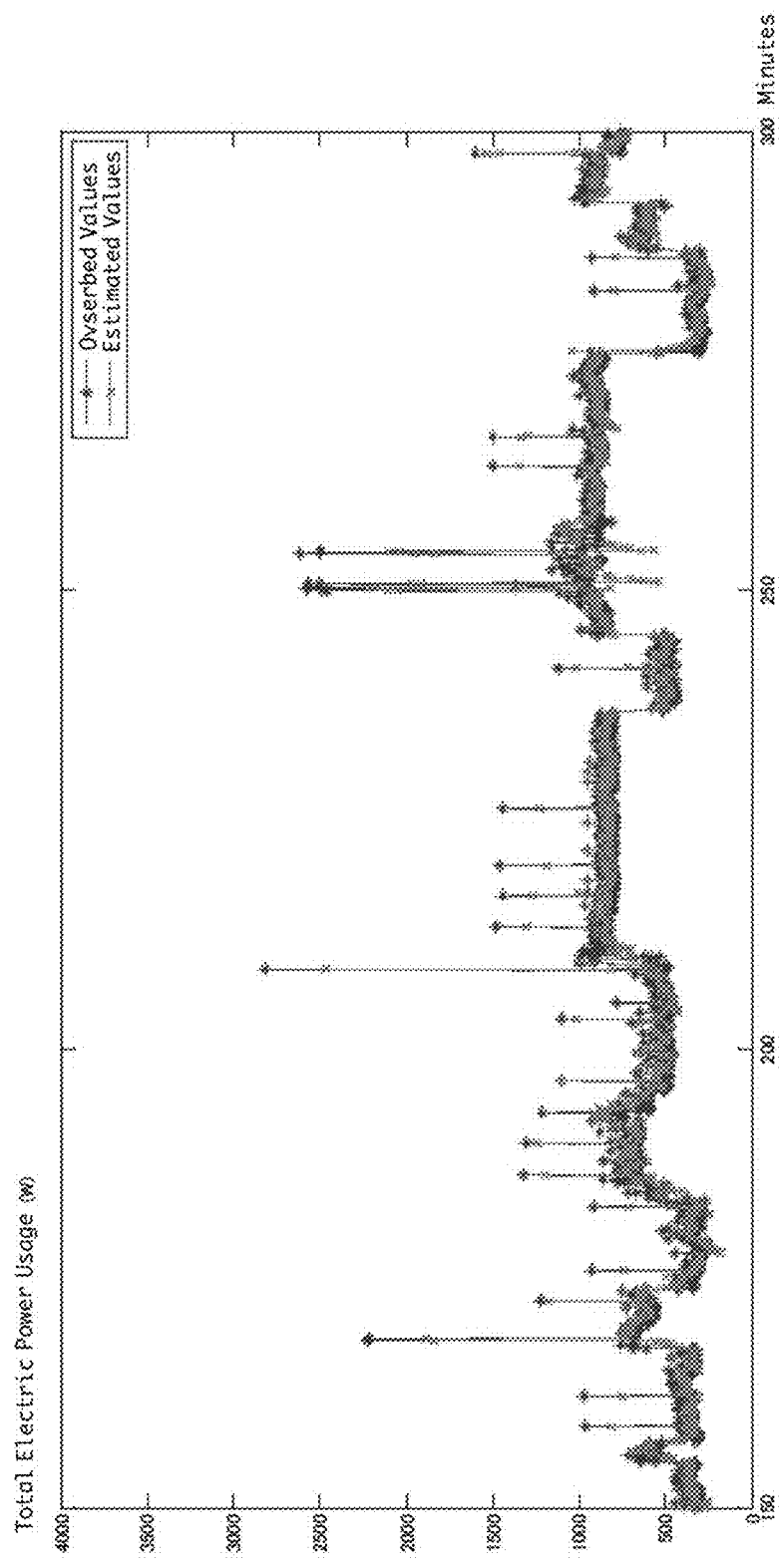
FIG. 13 is an enlarged diagram showing a part from 150 minutes to 300 minutes in the results shown in FIG. 11.

FIG. 12 is an enlarged diagram showing a part from the beginning of use up to 150 minutes which is cut off from the diagram in FIG. 11. In addition, FIG. 13 is an enlarged diagram showing a part from 150 minutes up to 300 minutes which is cut off from the diagram in FIG. 11.

It is understood from FIG. 12 that it has a high accuracy of estimation. That is, although there are errors between the observed values and the estimated values of the total electric power usage at some places within an area from the beginning of use to 150 minutes, a large error is not generated after 150 minutes between the observed value and the estimated values as shown in FIG. 13.

Figure 14:
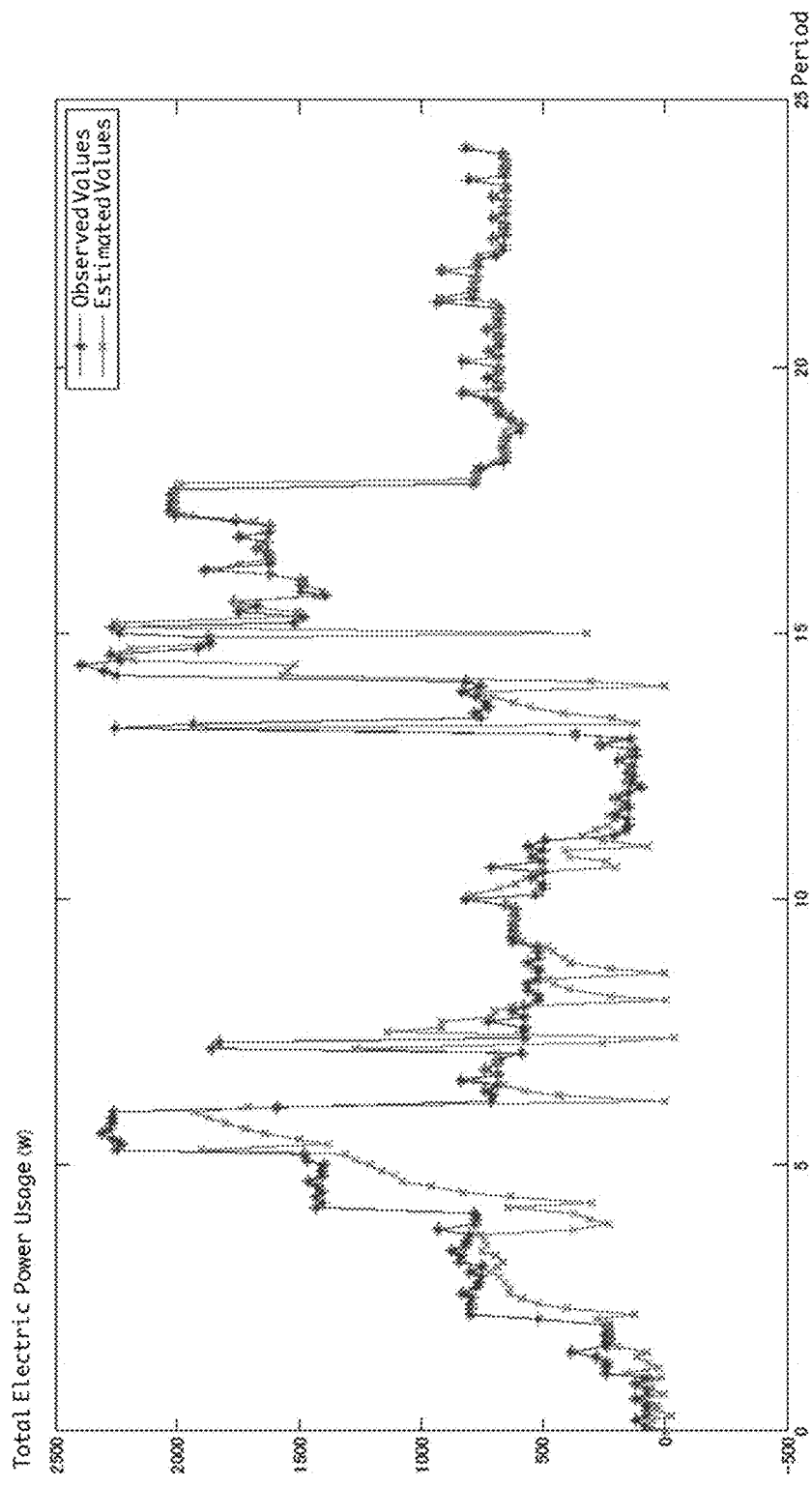
FIG. 14 is a diagram showing the results obtained when the types of the individual electrical appliances and their rated power by the invention using data measured at one minute intervals for four hours in a quasi-household environment where the individual electrical appliances are manually switched on and off.

FIG. 14 is a diagram of a result of the experiment, to which the embodiment is applied, and to estimate the types of the individual electrical appliances and their rated electric power consumptions, using data at one minute intervals during four hours in the quasi-household environment where the individual electrical appliances are manually switched on and off, then estimating the total electric power usage and the operation statuses of the individual electrical appliances. The dimension of the state variable vector was set variable in the Kalman filter of the embodiment, but it is necessary to consider how the state variable before its change is transferred after the change in a case where the state variable varies.

The result in FIG. 14 was obtained without allowing for the transfer of the state variable when the number of the types of the individual electrical appliances change, where the operation probability of the individual electrical appliances is cleared to 0. The types and their rated power consumptions of the individual electrical appliances are unknown from the beginning of use up to 150 minutes, and in addition the types of the individual electrical appliances vary. Nevertheless, the transfer of the state variable is not allowed for, so that there are some time points where the estimated value of the total electric power usage departs greatly from the observed value thereof.

However, after 150 minutes, without allowing for the transfer of the state variable when the number of the types of the individual electrical appliances changes, the number of the types of the individual electrical appliances reached a stable state by the learning, and a large difference between the observed value and the estimated value was not generated.

Figure 15:
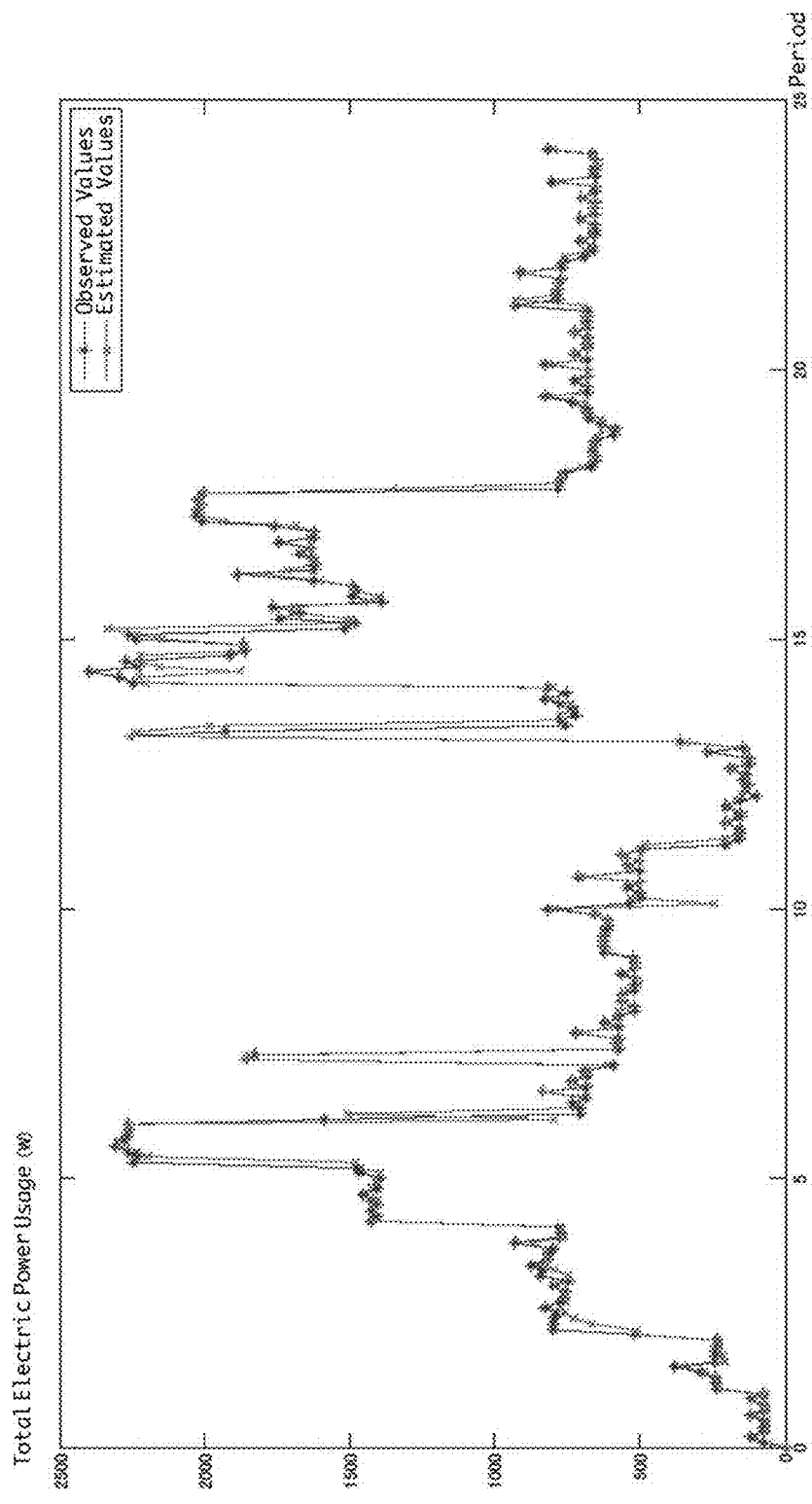
FIG. 15 is a diagram showing the results obtained when the total electric power usage and the operation statues are estimated, being allowed for transfer of state variables when the types of the individual electrical appliances and their rated power consumptions are estimated and the number of the types of the individual electrical appliances changes.

On the contrary, FIG. 15 shows a diagram of an estimation result of the total electric power and the operation statuses of the individual electrical appliances when the types and their rated power consumptions of the individual electrical appliances are estimated with allowing for the transfer of the state variable when the number of the individual electrical appliances changes.

There is not shown a large difference between the observed value and the estimated value of the total electric power usage from the beginning of use relative to the estimation without allowing for the transfer of the state variable in FIG. 14, and an estimation accuracy is improved from an initial stage.

As explained above, the individual electrical-appliance operation-status estimation device and its method of the embodiment has the following advantages.

That is, the individual electrical-appliance operation-status estimation device and its method of the embodiment can monitor the operation statuses of the individual electrical appliances (that is, what types of the electrical appliances there are, and what operation status what electrical appliances are in) in real time without installing a sensor on each electrical appliance or without prior information on how may electrical appliances of what types there are. Therefore, their costs become lower, and the application to ordinary households and others can be easier, so that they can save energy by improving the operation states of the electrical appliances and supply control of electric power.

In addition, the k-means algorism is used for clustering executed by the electrical-appliance type identification part 6a, and the number of clusters, k corresponding to the types of the individual electrical appliances, which is used in the k-means algorism, is set variable. Therefore, even when the types of the electrical appliances as monitoring objects change, in such a case where a new electrical appliance is added on the way and/or the electrical appliance used so far is disposed on the way, there is no need to input additional data of the type list nor delete the extra data therefrom each time it happens, thereby its labor becoming unnecessary. This enables an amateur to use the individual electrical-appliance operation-status estimation device of the embodiment.

The k-means algorism uses the EM algorism having the expectation step and the maximization step to estimate the averages and the variances of k number normal distributions, which are the instances from the unknown k number of normal distributions, based on the electric power that is inputted, and then it judges which normal distribution the instances thereof come from if the input jumps corresponding to the instances are detected. Therefore, necessary information on the individual electrical appliances can be obtained without knowing the increase and decrease of the number of the electrical appliances and without inputting the prior information thereof.

Further, the repeated calculation, which is executed at the intervals of the time variation, of the expectation step and the maximization step in the EM algorism is ordinarily repeated many times, but it employs the repeat calculation with only one step. Therefore, its estimation accuracy becomes higher as time elapses, after then being maintained at a sufficient level, because of the monotonicity of the likelihood of the EM algorism, so that its calculation cost can be lower.

Further, the k-means algorism normally uses all of data, while, in the maximization step of the embodiment, a length of past data going back for calculating at the maximization step is set shorter than that of the past data stored, so that the calculation can be done without using all of the data obtained so far. Therefore, its calculation cost can be lower.

Further, the EM algorism introduces a prior distribution based on the Bayesian learning, where the posterior distribution of the expected value is proportional to a product of the prior distribution of the expected value and the likelihood, in order to compute the expected value at the expectation step, and it estimates the learning result of at least one of variations, namely the time variation of probability of the occurrence of switching on and off of the individual electrical appliances, the variation due to different usage environments, and the variation of dates of usage, which are obtained from the past data on the total electric power usage and the jumped electric power. Therefore, the maximum likelihood can be estimated.

The device includes the Markov switching model that corresponds to a state variable of the operation probability of each electrical appliance, and the Kalman filter that gives an input variable corresponding the jumped electric power to the total electric power usage, using the state variable corresponding to the operation probability of each electrical appliance in the standard form of the state equation. Therefore, the estimation result obtained by the k-means algorism can be converted so as to be used in the Kalman filter by using the Markov switching model. This enables to estimate the operation statuses of the individual electrical appliances dynamically and in real time, Further, although the dimension of the state variable vector as the state variable of the Kalman filter is normally invariable, that of the embodiment is set variable. Therefore, in the case where a new electrical appliance is added on the way, and/or in the case where an electrical appliance used so far is disposed on the way, there is no need to input additional data of the type list nor delete the extra data therefrom, so that its labor becomes unnecessary. This eliminates a labor of inputting and deleting operations.

The invention has been explained above with reference to the embodiment, but the invention is not limited to the embodiment, and it is intended to cover in the appended claims all such modifications as fall within the scope of the invention.

For example, the individual electrical-appliance operation-status estimation device and its method of the invention may be applied to one ordinary home in the embodiment, but the invention is not limited to a common household, and it may be applied to one bundle of group houses.

Further, an object of individual electrical-appliance operation-status estimation device and its method of the invention may be individual ones or an interrogation one of distribution switchboards installed on a plurality of areas divided from one household, respectively.

In addition, the electric power meter is not limited to that installed in a common household, and the others may be used. Further, the calculations of the processes are not limited the equations used above in the embodiment.

Further, the jumped electric power is calculated from the first order difference of the total electric power usage in the embodiment, but the invention is not limited to that.

INDUSTRIAL APPLICABILITY

The individual electrical-appliance operation-status estimation device and its method of the invention is capable of being applied to various systems that estimate operation statuses of a plurality of electrical appliances as monitoring objects.

DESCRIPTION OF REFERENCE NUMBERS 1 house (household)
2 wiring
3a-3n electrical appliance
4 power supply wire
5 electric power meter (total power usage measure means)
6 operation status estimation part
6a time variation calculation part (time variation calculation means)
6b operating electrical-appliance type identification part (operating electrical-appliance type identification means)
6c corresponding probability estimation part (corresponding probability estimation means)
6d individual electrical-appliance operation-status estimation part (individual electrical-appliance operation-status estimation means)
6e Markov switching model
6f Kalman filter
7 display
8 distribution switchboard

The invention claimed is:

1. An individual electrical-appliance operation-status estimation device comprising:
a wiring;
a total electric power usage measurement means for measuring total electric power usage of a plurality of electrical appliances that are connected with the wiring;
a time variation calculation means for calculating jumped electric power, which corresponds to the first order differences of time variations in the total electric power usage and is capable of detecting switching on and off, based on the total electric power usage measured by the total electric power usage measurement means;
an operating electrical-appliance type identification means for judging, based on the jumped electric power calculated by the time variation calculation means, whether or not a type of a new electrical appliance should be added to an existing type list, and executing a clustering process, where clusters correspond to the types of the electrical appliances, in such a way that rated power consumption of each individual electrical appliance is recalculated in a case where the new type of the electrical appliance is added to the existing type list, an extra type being deleted from the existing type list as needed, and the existing type list being maintained in a case where the new type of the electrical appliance is not added to the existing type list;
a corresponding likelihood estimation means for estimating likelihood corresponding to occurrences of switching on and off events of the electrical appliances in which at least one of up and down jumps is generated; and
an individual electrical-appliance operation-status estimation means for estimating changes of operation statuses, of the individual electrical appliances when the likelihoods relating to the occurrences of switching on and off events of the individual electrical appliances, which are obtained from the jumps of the total electric power usage in present operation statuses of the individual electrical appliances by the corresponding likelihood estimation means, are inputted, updating estimation of present operation statuses of the individual electrical appliances, and optimizing estimation of types, rated power consumption and the operation statuses of the individual electrical appliances in real time based on predicted values of the total electric power usage, which is estimated by using estimation results of the updated operation statuses and the updated rated power consumption of the individual electrical appliances and measured data on the total electric power usage, to dynamically estimate operation probabilities, of the individual electrical appliances, which vary in time intervals of the time variation of the measured total electric power usage.

2. The individual electrical-appliance operation-status estimation device according to claim 1, wherein
the clustering process executed by the operating electrical-appliance type identification means is configured to employ a k-means algorism, and wherein
k, which is the number of clusters corresponding to the types of the individual electrical appliances and is used in the k-means algorism, is set to vary.

3. The individual electrical-appliance operation-status estimation device according to claim 2, wherein
the k-means algorism is configured to use an Expectation Maximization algorithm having an expectation step and a maximization step to estimate averages and variances of k number of normal distributions based on the jumped electric power that is inputted when the measured data is realized values of k number of unknown normal distributions, and judging which normal distribution the realized values corresponding to the inputted jumped electric power that is inputted comes from.

4. The individual electrical-appliance operation-status estimation device according to claim 3, wherein the Expectation Maximization algorism is configured to execute a recalculation at the expectation step and the maximization step by only one recalculation step at intervals of the time variations.

5. The individual electrical-appliance operation-status estimation device according to claim 4, wherein
a length of past data going back for calculating at the maximization step is set shorter than that of the past data stored.

6. The individual electrical-appliance operation-status estimation device according to claim 4, wherein
the Expectation Maximization algorism is configured to introduce a prior distribution, which is obtained by using Bayesian learning where posterior probability of expected value is proportional to a product of prior distribution of the expected value and the likelihood, in a calculation of the expected value at the expectation step, and wherein
the Expectation Maximization algorism is configured to use the expected value for estimation of a result of pattern learning of at least one of time variation of probability of occurrence of switching on and off events of the individual electrical appliances, variation due to usage environment, and variation of dates of usage which are obtained from past data of the total electric power usage and the jumped electric power.

7. The individual electrical-appliance operation-status estimation device according to claim 3, wherein
the Expectation Maximization algorism is configured to introduce a prior distribution, which is obtained by using Bayesian learning where posterior probability of expected value is proportional to a product of prior distribution of the expected value and the likelihood, in a calculation of the expected value at the expectation step, and wherein
the Expectation Maximization algorism is configured to use the expected value for estimation of a result of pattern learning of at least one of time variation of probability of occurrence of switching on and off events of the individual electrical appliances, variation due to usage environment, and variation of dates of usage which are obtained from past data of the total electric power usage and the jumped electric power.

8. The individual electrical-appliance operation-status estimation device according to claim 3, wherein
a length of past data going back for calculating at the maximization step is set shorter than that of the past data stored.

9. The individual electrical-appliance operation-status estimation device according to claim 3, further comprising:
a Markov switching model configured to correspond output of the k-means algorism to a state variable of operation probability of each electrical appliance; and
a Kalman filter configured to incorporate the jumped electric power of the total electric power usage to each input variable of a standard form of a state equation to use the state variable corresponding to operation probability of each electrical appliance.

10. The individual electrical-appliance operation-status estimation device according to claim 2, further comprising:
a Markov switching model configured to correspond output of the k-means algorism to a state variable of operation probability of each electrical appliance; and
a Kalman filter configured to incorporate the jumped electric power of the total electric power usage to each input variable of a standard form of a state equation to use the state variable corresponding to operation probability of each electrical appliance.

11. The individual electrical-appliance operation-status estimation device according to claim 10, wherein
the state variable of the Kalman filter is configured to be a state variable vector with variable dimensions.

12. An individual electrical-appliance operation-status estimation method comprising:
connecting a plurality of electrical appliances with a wiring;
measuring total electric power usage of the plurality of electrical appliances;
calculating jumped electric power, which corresponds to the first order differences of time variations in total electric power usage and is capable of detecting switching on and off, based on the total electric power usage measured by a total electric power usage measurement means;
judging, based on the jumped electric power, whether or not a new type of the electrical appliance should be added to an existing type list, and executing a clustering process, where clusters correspond to the types of the electrical appliances, in such a way that rated power consumption of each type of the individual electrical appliance is recalculated in a case where the new type of the electrical appliance is added to the existing type list, an extra type being deleted from the existing type list as needed, and the existing type list being maintained in a case where the new type of the electrical appliance is not added to the existing type list;
estimating likelihood corresponding to occurrences of switching on and off events of the electrical appliances in which at least one of up and down jumps is generated; and
estimating changes of operating states, of the individual electrical appliances when the likelihoods relating to the occurrences of switching on and off events of the individual electrical appliances, which are obtained from the jumps of the total electric power usage in present operating states of the individual electrical appliances by a corresponding likelihood estimation means, are inputted, updating estimation of the present operation statuses of the individual electrical appliances, and optimizing estimation of types, rated power consumption and the operating states of the individual electrical appliances in real time based on predicted values of the total electric power usage, which is estimated by using estimation results of updated operation statuses and rated power consumption of the individual electrical appliances and measured data on the total electric power usage, to dynamically estimate operation probabilities of the individual electrical appliances, which vary in time intervals of the time variation of the measured total electric power usage.

13. The individual electrical-appliance operation-status estimation method according to claim 12, wherein
the clustering process is configured to use an Expectation Maximization k-means algorithm, and wherein
k, which is the number of clusters corresponding to the types of the individual electrical appliances and is used in the k-means algorism, is set to vary.

14. The individual electrical-appliance operation-status estimation method according to claim 13, wherein
the k-means algorism is configured to use an Expectation Maximization algorism having an expectation step and a maximization step to estimate averages and variances of k number of normal distributions based on the jumped electric power that is inputted when the measured data is realized values of k number of unknown normal distributions, and judging which normal distribution the realized values corresponding to the jumped electric power that is inputted comes from.

15. The individual electrical-appliance operation-status estimation method according to claim 14, wherein
the Expectation Maximization algorism is configured to execute a recalculation at the expectation step and the maximization step by only one recalculation step at intervals of the time variations.

16. The individual electrical-appliance operation-status estimation method according to claim 14, wherein
a length of past data going back for calculating at the maximization step is set shorter than that of the past data stored.

17. The individual electrical-appliance operation-status estimation method according to claim 14, wherein
the Expectation Maximization algorism is configured to introduce a prior distribution, which is obtained by using Bayesian learning where posterior probability of expected value is proportional to a product of prior distribution of the expected value and the likelihood, in a calculation of the expected value at the expectation step, and wherein
the Expectation Maximization algorism is configured to use the expected value for estimation of a result of pattern learning of at least one of time variation of probability of occurrence of switching on and off events of the individual electrical appliances, variation due to usage environment, and variation of dates of usage which are obtained from past data of the total electric power usage and the jumped electric power.

18. The individual electrical-appliance operation-status estimation method according to claim 14, further comprising:
corresponding output of the k-means algorism to a state variable of operation probability of each electrical appliance by a Markov switching model; and
incorporating the jumped electric power of the total electric power usage to each input variable of a standard form of a state equation to use the state variable corresponding to operation probability of each electrical appliance by a Kalman filter.

19. The individual electrical-appliance operation-status estimation method according to claim 12, further comprising:
corresponding output of the k-means algorism to a state variable of operation probability of each electrical appliance by a Markov switching model; and
incorporating the jumped electric power of the total electric power usage to each input variable of a standard form of a state equation to use the state variable corresponding to operation probability of each electrical appliance by a Kalman filter.

20. The individual electrical-appliance operation-status estimation method according to claim 19, wherein
the state variable of the Kalman filter is configured to be a state variable vector with variable dimensions.

* * * * *